US008907695B2

(12) United States Patent
Tan et al.

(10) Patent No.: US 8,907,695 B2
(45) Date of Patent: Dec. 9, 2014

(54) DETECTING METHOD AND DETECTING DEVICE OF ABNORMALITY OF DIFFERENTIAL SIGNAL RECEIVING TERMINAL OF LIQUID CRYSTAL DISPLAYING MODULE

(75) Inventors: Xiaoping Tan, Guangdong (CN); Nianmao Wang, Guangdong (CN)

(73) Assignee: Shenzhen China Star Optoelectronics Technology Co., Ltd., Guangming New District, Shenzhen, Guangdong (CN)

(*) Notice: Subject to any disclaimer, the term of this patent is extended or adjusted under 35 U.S.C. 154(b) by 367 days.

(21) Appl. No.: 13/574,845

(22) PCT Filed: May 25, 2012

(86) PCT No.: PCT/CN2012/076088
§ 371 (c)(1),
(2), (4) Date: Jul. 24, 2012

(87) PCT Pub. No.: WO2013/159421
PCT Pub. Date: Oct. 31, 2013

(65) Prior Publication Data

US 2013/0285693 A1 Oct. 31, 2013

(30) Foreign Application Priority Data

Apr. 27, 2012 (CN) .......................... 2012 1 0129075

(51) Int. Cl.
*G01R 31/02* (2006.01)

(52) U.S. Cl.
CPC ...................................... *G01R 31/02* (2013.01)
USPC ...................................................... 324/760.01

(58) Field of Classification Search
CPC ..... G06F 3/0412; G06F 3/1423; G06F 3/041; G09G 3/36; G09G 2310/04; G09G 2356/00; G01R 31/02
USPC ............... 324/762.01–762.1, 760.01–760.02; 714/812; 345/101
See application file for complete search history.

(56) References Cited

U.S. PATENT DOCUMENTS 5,491,706 A * 2/1996 Tagawa et al. ................ 714/812
5,717,421 A * 2/1998 Katakura et al. .............. 345/101
8,266,335 B2 9/2012 Kitano et al.
2010/0164936 A1 7/2010 Park et al.

FOREIGN PATENT DOCUMENTS

CN 101677356 A 3/2010
CN 101697003 A 4/2010

(Continued)

OTHER PUBLICATIONS

International Search Report for Application No. PCT/CN/2012/076088 dated Jan. 31, 2013.

*Primary Examiner* — Tung X Nguyen
(74) *Attorney, Agent, or Firm* — Winston Hsu; Scott Margo

(57) ABSTRACT

A detecting method of abnormality of a differential signal receiving terminal of a liquid crystal displaying module, including: inputting high level signals to LVDS0+, LVDS0−, LVDS1+, LVDS− in order, in which only one high level signal is inputted to one of the differential signal lines and the other differential signal lines are kept in high impedance states simultaneously; and receiving feedback signals from all the differential signal lines and determining whether the differential signal lines of detecting units are abnormal or not according to the received feedback signals. The abnormality of the differential signal lines includes terminal resistive opens of the differential signal lines, a short circuit between two adjacent groups of differential signal lines, and short circuits of the differential signal lines to ground or to a power supply caused by abnormal power supplying sequence. By inputting high level signals to the differential signal lines in order and receiving the feedback signal from each differential signal line, the abnormality of the receiving terminal can be detected quickly according to the received feedback signals. This not only reduces the labor cost and time cost, but also improves the detecting efficiency of the abnormality.

19 Claims, 17 Drawing Sheets

(56) References Cited

FOREIGN PATENT DOCUMENTS

| | | | |
|---|---|---|---|
| CN | 101882427 | A | 11/2010 |
| CN | 101950516 | A | 1/2011 |
| CN | 101958092 | A | 1/2011 |
| CN | 202084273 | U | 12/2011 |
| JP | 2007183192 | A | 7/2007 |

* cited by examiner

DETECTING METHOD AND DETECTING DEVICE OF ABNORMALITY OF DIFFERENTIAL SIGNAL RECEIVING TERMINAL OF LIQUID CRYSTAL DISPLAYING MODULE

CROSS-REFERENCE TO RELATED APPLICATIONS

This is the U.S. National Stage of International Patent Application No. PCT/CN2012/076088, having an international filing date of May 25, 2012, and which claims the priority benefit of Chinese Patent Application No. 201210129075.0, filed Apr. 27, 2012, the entire contents of each of which is expressly incorporated herein by reference.

BACKGROUND

1. Technical Field

The present disclosure relates to liquid crystal displaying technologies, and particularly, to a detecting method and a detecting device of abnormality of differential signal receiving terminal of a liquid crystal displaying module.

2. Description of Related Art

Liquid crystal display (LCD) is a flat panel display (FPD) that uses the characteristics of liquid crystal to display image. Compared to other types of display, the LCD is thin and it requires lower driving voltage and lower power consumption, which makes it the mainstream product in the consumer goods market. Brightness, contrast, color, and viewing angle of a LCD are mainly decided by the liquid crystal panel of the LCD. Thus, the quality of the liquid crystal panel influences the quality of the LCD directly.

In the conventional driving method of the liquid crystal panel, differential signals are transmitted from a differential signal generator to the liquid crystal panel through a cable. However, in the manufacturing process of the liquid crystal panel, controlling substrates of the liquid crystal displaying module often cannot work properly in SMT production process or in assembling process of the liquid crystal displaying module due to resistive open of the differential terminal, short circuits between the differential signals, short circuits to ground of the differential signals caused by abnormal power supplying sequence.

In the above problems, although the detector can detect the resistive open of the differential terminal and short circuits between the differential signals via magnifiers, however, this increases the manufacturing cost of the liquid crystal panel and further results in a low efficiency. Therefore, it is necessary to provide a detecting method capable of detecting the above problems quickly.

SUMMARY

One object of the present disclosure is to provide a detecting method of abnormality of a differential signal receiving terminal of a liquid crystal displaying module, which is capable of determining the abnormality of the differential signal receiving terminal quickly.

The receiving terminal includes a first group of differential signal line having LVDS0+ and LVDS0−, and a second group of differential signal line having LVDS1+ and LVDS1−. The detecting method includes:

inputting high level signals to LVDS0+, LVDS0−, LVDS1+, LVDS− in order, in which only one high level signal is inputted to one of the differential signal lines each single time and the other differential signal lines are kept in high impedance states simultaneously; and receiving feedback signals from all the differential signal lines and determining whether the differential signal lines of detecting units are abnormal or not according to the received feedback signals. The abnormality of the differential signal lines includes a terminal resistive open of each group of differential signal line, a short circuit between two adjacent groups of the differential signal lines, and a short circuit of each group of differential signal line to ground or to a power supply caused by abnormal power supplying sequence.

Preferably, if the feedback signals from the differential signal lines are HHHH, HHHH, HHHH, and HHHH when high level signals are respectively inputted to the differential signal lines LVDS0+, LVDS0−, LVDS1+, and LVDS1− in order, concluding that the abnormality is the short circuit between two adjacent groups of differential signal lines.

Preferably, if the feedback signals from the differential signal lines are LLLL, LLLL, LLHH, and LLHH when high level signals are respectively inputted to the differential signal lines LVDS0+, LVDS0−, LVDS1+, and LVDS1− in order, concluding that the abnormality is the short circuit of the first group of differential signal line to ground; if the feedback signals from the differential signal lines are HHLL, HHLL, HHHH, and HHHH, concluding that the abnormality is the short circuit of the first group of differential signal line to the power supply.

Preferably, if the feedback signals from the differential signal lines are HLLL, LHLL, LLHH, and LLHH when high level signals are respectively inputted to the differential signal lines LVDS0+, LVDS0−, LVDS1+, and LVDS1− in order, concluding that the abnormality is the terminal resistive open of the first group of differential signal line.

Preferably, if the feedback signals from the differential signal lines are HHHH, LHHH, LHHH, and LHHH when high level signals are respectively inputted to the differential signal lines LVDS0+, LVDS0−, LVDS1+, and LVDS1− in order, concluding that the abnormality includes the short circuit between two adjacent groups of differential signal lines, the terminal resistive open of the first group of differential signal line, and the short circuit of the first group of differential signal line to the power supply.

Preferably, if the feedback signals from the differential signal lines are LLLL, LLLL, LLLL, and LLLL when high level signals are respectively inputted to the differential signal lines LVDS0+, LVDS0−, LVDS1+, and LVDS1− in order, concluding that the abnormality includes the short circuit between two adjacent groups of differential signal lines and the short circuit of the first group of differential signal line to ground.

Preferably, if the feedback signals from the differential signal lines are HHLL, LHLL, LHHH, and LHHH when high level signals are respectively inputted to the differential signal lines LVDS0+, LVDS0−, LVDS1+, and LVDS1− in order, concluding that the abnormality includes the short circuit between two adjacent groups of differential signal lines and the short circuit of the first group of differential signal line to the power supply; if the feedback signals from the differential signal lines are HLLL, LLLL, LLHH, and LLHH, concluding that the abnormality includes the terminal resistive open of the differential signal lines and the short circuit of the first group of differential signal line to ground.

Preferably, if the feedback signals from the differential signal lines are HLLL, LHHH, LHHH, and LHHH when high level signals are respectively inputted to the differential signal lines LVDS0+, LVDS0−, LVDS1+, and LVDS1− in order, concluding that the abnormality includes the short circuit between two adjacent groups of differential signal lines and the terminal resistive open of the first group of differential signal line.

Preferably, if the feedback signals from the differential signal lines are HLLL, LLLL, LLLL, and LLLL when high level signals are respectively inputted to the differential signal lines LVDS0+, LVDS0−, LVDS1+, and LVDS1− in order, concluding that the abnormality includes the short circuit between two adjacent groups of differential signal lines, the terminal resistive open of the first group of differential signal line, and the short circuit of the first group of differential signal line to ground.

The present disclosure further provides another detecting method of abnormality of a differential signal receiving terminal of a liquid crystal displaying module. The detecting method including:

taking two adjacent groups of differential signal lines as a detecting unit, inputting high level signals to all differential signal lines of the detecting unit, in which only one high level signal is inputted to one of the differential signal lines each single time and the other differential signal lines are kept in high impedance states simultaneously; and receiving feedback signals from all the differential signal lines and determining whether the differential signal lines of the detecting unit are abnormal or not according to the feedback signals.

Preferably, the step of determining whether the differential signal lines of the detecting unit are abnormal or not according to the feedback signals includes:

if the feedback signals from all the differential signal lines are high level signals when a high level signal is inputted to a positive differential signal line of a first group of differential signal line and the other differential signal lines are kept in high impedance states, further determining whether the feedback signals from all the differential signal lines are high level signals or not when a high level signal is inputted to a negative differential signal line of the first group of differential signal line and the other differential signal lines are kept in high impedance states;

concluding that the abnormality includes the short circuit between two adjacent groups of differential signal lines if the feedback signals from all the differential signal lines are high level signals; otherwise, concluding that the abnormality includes the short circuit between two adjacent groups of differential signal lines, a terminal resistive open of the first group of differential signal line, and a short circuit of the first group of differential signal line to a power supply.

Preferably, the step of determining whether the differential signal lines of the detecting unit are abnormal or not according to the feedback signals includes:

if the feedback signals from all the differential signal lines are low level signals when a high level signal is inputted to the positive of the first group of differential signal line and the other differential signal lines are kept in high impedance states, further determining whether the feedback signal from a positive differential signal line of a second group of differential signal line is a high level signal or not when two high level signals are respectively inputted to the positive differential signal line and a negative differential line of the second group of differential signal line in order and the other differential signal lines are kept in high impedance states;

concluding that the abnormality includes the short circuit of the first group of differential signal line to ground if the feedback signal from the positive differential signal line is a high level signal; otherwise, concluding that the abnormality includes the short circuit between two adjacent groups of differential signal lines and the short circuit of the first group of differential signal line to ground.

Preferably, the step of determining whether the differential signal lines of the detecting unit are abnormal or not according to the feedback signals includes:

if the feedback signals from the first group of differential signal line are both high level signals and the feedback signals from the second group of differential signal line are both low level signals when a high level signal is inputted to the positive differential signal line of the first group of differential signal line and the other differential lines are kept in high impedance states, further determining that whether the feedback signals from all the differential signal lines are high level signals or not when two high level signals are respectively inputted to the positive differential signal line and the negative differential signal line of the second group of differential signal line in order and the other differential signal lines are kept in high impedance states;

concluding that the abnormality includes the short circuit of the first group of differential signal line to the power supply if the feedback signals from all the differential signal lines are high level signals; otherwise, concluding that the abnormality includes the terminal resistive open of the first group of differential signal line and the short circuit of the first group of differential signal line to the power supply.

Preferably, the step of determining whether the differential signal lines of the detecting unit are abnormal or not according to the feedback signals includes:

if the feedback signal from the positive differential signal line of the first group of differential signal line is a high level signal and the feedback signals from the other differential signal lines are low level signals when a high level signal is inputted to the positive differential signal line of the first group of differential signal line and the feedback signals from the other differential signal lines are kept in high impedance states, further determining the corresponding feedback signal is a high level signal or a low level signal when a high level signal is inputted to the negative differential signal line of the first group of differential signal line and the other differential signal lines are kept in high impedance states;

if the feedback signal from the positive differential signal line of the first group of differential signal line is a high level signal and the feedback signals from the other differential signal lines are low level signals, concluding that abnormality includes the terminal resistive open of the first group of differential line;

if the feedback signal from the positive differential signal line of the first group of differential signal line is a low level signal and the feedback signals from the other differential signal lines are high level signals, concluding that the abnormality includes the short circuit between two adjacent groups of differential signal lines and the terminal resistive open of the first group of differential signal line;

if the feedback signals from all the differential signal lines are low level signals, and the feedback signal from the positive differential signal line of the second group of differential signal line is a high level signal when two high level signals are respectively inputted to the positive differential signal line and the negative differential signal line of the second group of differential signal line in order and the other differential signal lines are kept in high impedance states, concluding that the abnormality includes the terminal resistive open of the first group of differential signal line and the short circuit of the first group of differential signal line to ground;

if the feedback signals from all the differential signal lines are low level signals, and the feedback signal from the positive differential signal line of the second group of differential signal line is a low level signal when two high level signals are respectively inputted to the positive differential signal line and the negative differential signal line of the second group of differential signal line in order and the other differential signal lines are kept in high impedance states, concluding that the abnormality includes the short circuit between two adjacent groups of differential signal lines, the terminal resistive open of the first group of differential signal line, and the short circuit of the first group of differential signal line to ground.

The present disclosure further provides a detecting device of abnormality of differential signal receiving terminals of a liquid crystal displaying module, including:

a signal outputting module for outputting high level signals to differential signal lines of a detecting unit including two adjacent groups of differential signal lines, in which only one high level signal is inputted to one of the differential signal lines each single time and the other differential signal lines are kept in high impedance state simultaneously; and an abnormality determining module for receiving feedback signals from all the differential signal lines and determining the abnormality of the differential signal lines of the detecting unit according to the feedback signals.

Preferably, the abnormality determining module includes a first determining unit; the first determining unit is used for determining whether the feedback signals from all the differential signal lines are high level signals or not when a high level signal is inputted to a positive differential signal of a first group of differential signal line and the other differential signal lines are kept in high impedance states; if the feedback signals from all the differential signal lines are high level signals, the first determining unit further determines whether the feedback signals from all the differential signal lines are high level signals or not when a high level signal is inputted to a negative differential signal line of the first group of differential signal line and the other differential signal lines are kept in high impedance states;

the first determining unit concludes that the abnormality is the short circuit between two adjacent groups of differential signal lines if the feedback signals from all the differential signal lines are high level signals; otherwise the first determining unit concludes that the abnormality includes a short circuit between two adjacent groups of differential signal lines, a terminal resistive open of the first group differential signal line, and a short circuit of the first group of differential signal line to a power supply.

Preferably, the abnormality determining module further includes a second determining unit, the second determining unit is used for determining whether the feedback signals from all the differential signal lines are low level signals or not when a high level signal is inputted to the positive differential signal line of the first group of differential signal line and the other differential signal lines are kept in high impedance states; if the feedback signals from all the differential signal lines are low level signals, the second determining unit determines whether the feedback signal from a positive differential signal line of a second group of differential signal line is high level signal or not when two high level signals are respectively inputted to the positive differential signal line and a negative differential signal line of the second group of differential signal line in order and the other differential signal lines are kept in high impedance states;

the second determining unit concludes that the abnormality is the short circuit of the first group of differential signal to ground if the feedback signal from the positive differential signal of the second group of differential signal line is high level signal; otherwise the second determining unit concludes that the abnormality includes the short circuit between two adjacent groups of differential signal lines and the short of the first group of differential signal line to ground.

Preferably, the abnormality determining module further includes a third determining unit; the third determining unit is used for determining whether the feedback signals from the first group of differential signal line are both high level signals and the feedback signals from the second group of differential signal line are both low level signals or not when a high level signal is inputted to the positive differential signal line of the first group of differential signal line and the other differential signal lines are kept in high impedance states; if the feedback signals from the first group of differential signal line are both high level signals and the feedback signals from the second group of differential signal line are both low level signals, the third determining unit further determines whether the feedback signal from all the differential signal lines are high level signals or not when two high level signals are respectively inputted to the positive differential signal line and the negative differential signal line of the second group of differential signal line in order and the other differential signal lines are kept in high impedance states;

the third determining unit concludes that the abnormality is the short circuit of the first group of differential signal line to the power supply if the feedback signals from all the differential signal lines are high level signals; otherwise the third determining unit concludes that the abnormality includes the terminal resistive open of the first group of differential signal line and the short circuit of the first group of differential signal line to the power supply.

Preferably, the abnormality determining module further includes a fourth determining unit; the fourth determining unit is used for determining whether the feedback signals from the positive differential signal line of the first group of differential signal line is a high level signal and the feedback signals from of the other differential signal lines are low level signals or not when a high level signal is inputted to the positive differential signal line of the first group of differential signal line and the other differential signal lines are kept in high impedance states; if the feedback signals from the positive differential signal line of the first group of differential signal line is a high level signal and the feedback signals from of the other differential signal lines are low level signals, the fourth determining unit further determines the corresponding feedback signal is a high level signal or a low level signal when a high level signal is inputted to the negative differential signal line of the second group of differential signal line and the other differential signal lines are kept in high impedance states;

if the feedback signal from the negative differential signal line of the first group of differential signal line is a high level signal and the feedback signals from the other differential signal lines are low level signals, the fourth determining unit concludes that the abnormality is the terminal resistive open of the first group of differential signal line;

if the feedback signal from the positive differential signal line of the first group of differential signal line is a low level signal and the feedback signals from the other differential signal line are high level signals, the fourth determining unit concludes that the abnormality includes the short circuit between two adjacent groups of differential signal lines and the terminal resistive open of the first group of differential signal line;

if the feedbacks from all the differential signal lines are low level signals, and the feedback signal from the positive differential signal line of the second group of differential signal line is a high level signal when two high level signals are respectively inputted to the positive differential signal line and the negative differential signal line of the second group of differential signal line in order and the other differential signal lines are kept in high impedance states, the fourth determining unit concludes that the abnormality includes the terminal resistive open of the first group of differential signal line and the short circuit of the first group of differential signal line to ground;

if the feedbacks from all the differential signal lines are low level signals, and the feedback signal from the positive differential signal line of the second group of differential signal line is a low level signal when two high level signals are respectively inputted to the positive differential signal line and the negative differential signal line of the second group of differential signal line in order and the other differential signal lines are kept in high impedance states, the fourth determining unit concludes that the abnormality includes the short circuit between two adjacent groups of differential signal lines, the terminal resistive open of the first group of differential signal line and the short circuit of the first group of differential signal line to ground.

By inputting high level signals to the differential signal lines in order and receiving the feedback signal from each of the differential signal lines, whether the differential signal receiving terminal of the liquid crystal displaying module is abnormal or not can be determined according to the feedback signals without manual test. This reduces the labor cost and time cost, and further improves the detecting efficiency of the abnormality.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
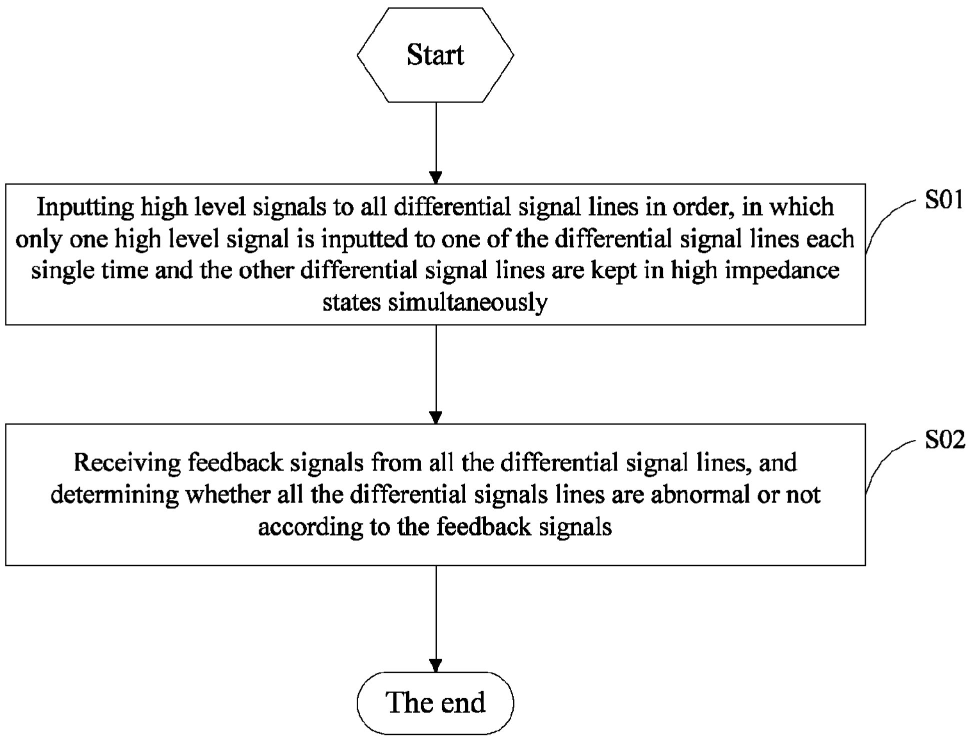
FIG. 1 is a flow chart of a detecting method of abnormality of differential signals receiving terminal of a liquid crystal displaying module in accordance with a first embodiment of the present disclosure.

Referring to FIG. 1, which is a flow chart of a detecting method of abnormality of differential signal receiving terminal of a liquid crystal displaying module in accordance with a first embodiment of the present disclosure. The liquid crystal displaying module in the present disclosure may include a number of receiving terminals for receiving a number of differential signals simultaneously. In the embodiment, the liquid crystal displaying module includes two groups of the receiving terminals.

The detecting method includes the following steps:

Step S01, inputting high level signals to all differential signal lines in order, in which only one high level signal is inputted to one of the differential signal lines and the other differential signal lines are kept in high impedance states each single time.

Step S02, receiving feedback signals from all the differential signal lines, and determining whether all the differential signals lines are abnormal or not according to the feedback signals.

The differential signal receiving terminal includes a first group of differential signal line LVDS0 and a second group of differential signal line LVDS1. The first group of differential signal line LVDS0 includes a positive differential signal line LVDS0+ and a negative differential signal line LVDS0−. Similarly, the second group of differential signal line includes a positive differential signal line LVDS1+ and a negative differential signal line LVDS1−.

By inputting a high level signal to one of the differential signal lines and keeping the other differential signal lines in high impedance states each single time, whether the receiving terminal is abnormal or not can be determined according to the feedback signals from all the differential signal lines. The abnormality of the receiving terminal includes a terminal resistive open of each differential signal lines, a short circuit between the two adjacent groups of the differential signal lines, a short circuit of each group of differential signal line to ground or to a power supply caused by abnormal power supplying sequence. It is noted that in the embodiment, the abnormality includes the terminal resistive open of one of the two groups of differential signal lines, the short circuit of the group of differential signal line to ground or the power supply caused by abnormal power supplying sequence. Each of the abnormality will be given in detail description in the following.

Figure 2:
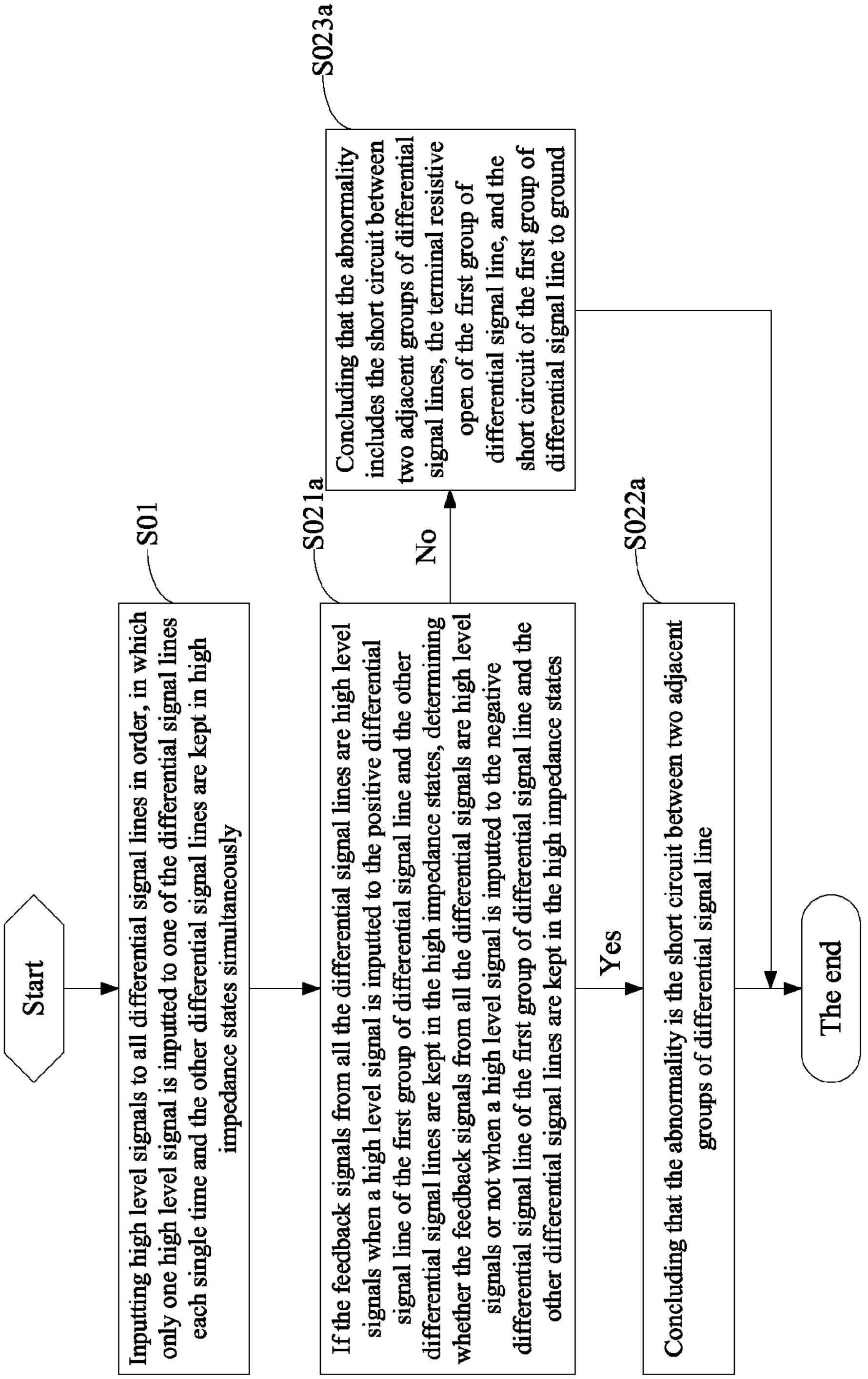
FIG. 2 is a flow chart of the step of determining the abnormality according to feedback signals of the detecting method of FIG. 1 in accordance with a first embodiment of the present disclosure.

Referring to FIG. 2, the step of determining the abnormality according to feedback signals of the detecting method, in accordance with a first embodiment, is shown. The step S02 in the first embodiment specifically includes the following steps:

Step S021*a*, if the feedback signals from all the differential signal lines are high level signals when a high level signal is inputted to the positive differential signal line of the first group of differential signal line and the other differential signal lines are kept in the high impedance states, determining whether the feedback signals from all the differential signals are high level signals or not when a high level signal is inputted to the negative differential signal line of the first group of differential signal line and the other differential signal lines are kept in the high impedance states; if all the feedback signals are high level signals at this time, the step S022*a* is implemented, otherwise the step S023*a* is implemented.

Step S022*a*, concluding that the abnormality is the short circuit between two adjacent groups of differential signal lines.

Figure 3:
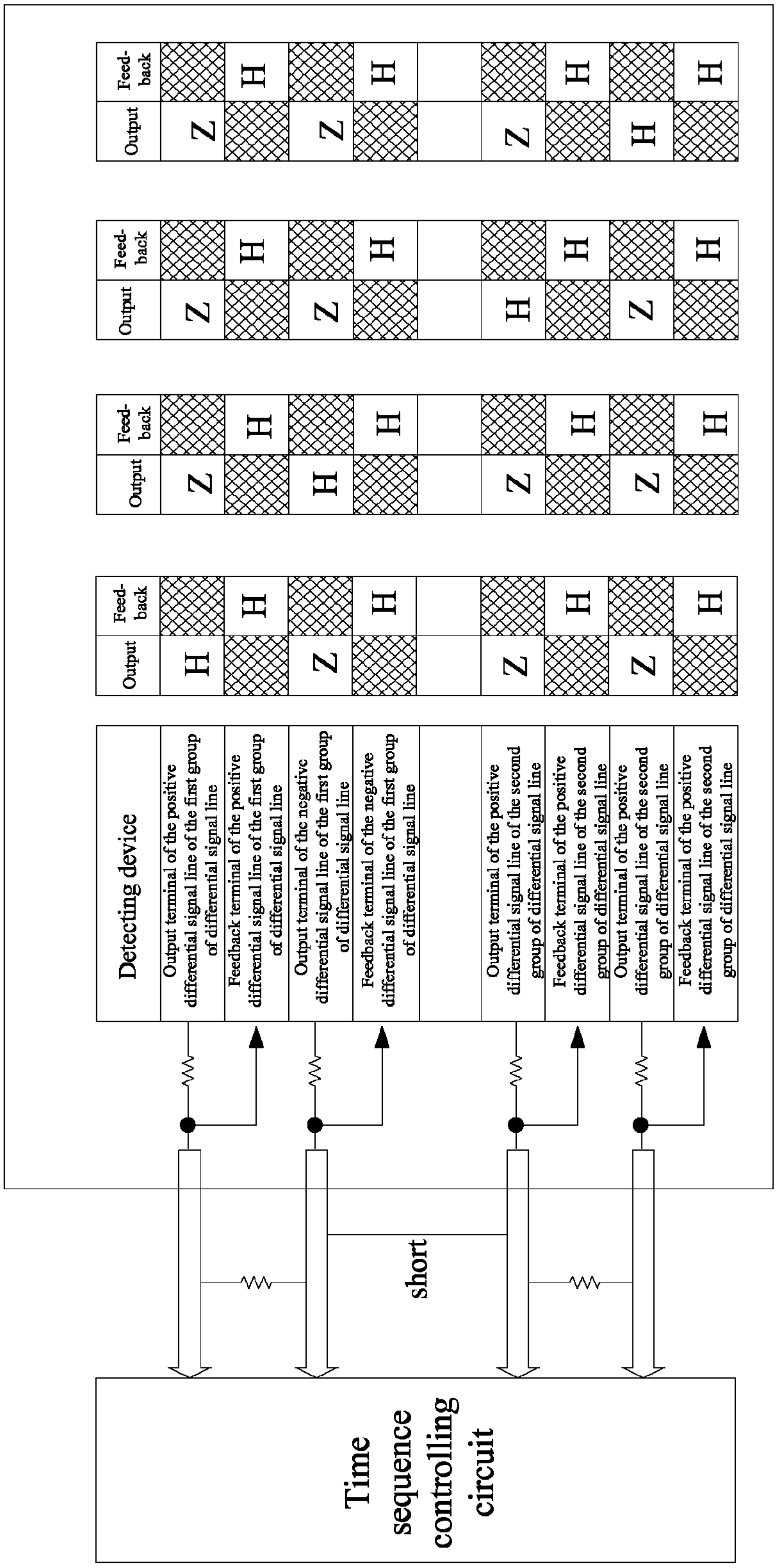
FIG. 3 is a schematic view showing the detecting result when the abnormality is a short circuit between two adjacent groups of differential signal lines.

Referring to FIG. 3, which is a schematic view showing the detecting result when the abnormality is the short circuit between two adjacent groups of differential signal lines. A detecting device is provided to detect the abnormality. The detecting device includes an output terminal and a feedback terminal of the positive differential signal line of the first group of differential signal line, an output terminal and a feedback terminal of the negative differential signal line of the first group of differential signal line, an output terminal and a feedback terminal of the positive differential signal line of the second group of differential signal line, an output terminal and a feedback terminal of the negative differential signal line of the second group of differential signal line. Signals are respectively inputted to input terminals of the differential signal receiving terminal via the output terminals of the positive and negative differential signal lines of the first and second groups of differential signal lines. The feedback signals from the differential signal receiving terminal are received by the feedback terminals of the positive and negative differential signal lines of the first and second groups of differential signal lines. The detecting result is shown as the followings: (wherein H is referred to a high level signal, L is referred to a low level signal, and Z is referred to the high impedance state)

when a high level signal is inputted to LVDS0+, and LVDS0−, LVDS1+, and LVDS1− are kept in high impedance states, the feedback signal received by the detecting device are HHHH;

when a high level signal is inputted to LVDS0− and LVDS0+, LVDS1+, and LVDS1− are kept in high impedance states, the feedback signal received by the detecting device are HHHH;

when a high level signal is inputted to LVDS1+ and LVDS0+, LVDS0−, and LVDS1− are kept in high impedance states, the feedback signal received by the detecting device are HHHH; and when a high level signal is inputted to LVDS1− and LVDS0+, LVDS0−, and LVDS1+ are kept in high impedance states, the feedback signal received by the detecting device are HHHH.

It is noted that since the feedback signals received by the detecting device when the first group of differential signal line is short circuited to the power supply is the same as the feedback signal received by the detecting device when the two groups of differential signal lines are short circuited to each other, it can be determined whether the two groups of differential signal lines are short circuited to each other at first. In this way, whether the first group of differential signal line is short circuited to ground can be determined after the short circuit between the two groups of differential signal lines is eliminated. In other embodiments, whether the first group of differential signal line is short circuited to ground can also be determined at first. After the abnormality of the short circuit of the first group of differential signal to ground is eliminated, it can be further determined whether there is the short circuit between the two groups of differential signal lines.

Step S023*a*, concluding that the abnormality includes the short circuit between two adjacent groups of differential signal lines, the terminal resistive open of the first group of differential signal line, and the short circuit of the first group of differential signal line to ground.

Figure 4:
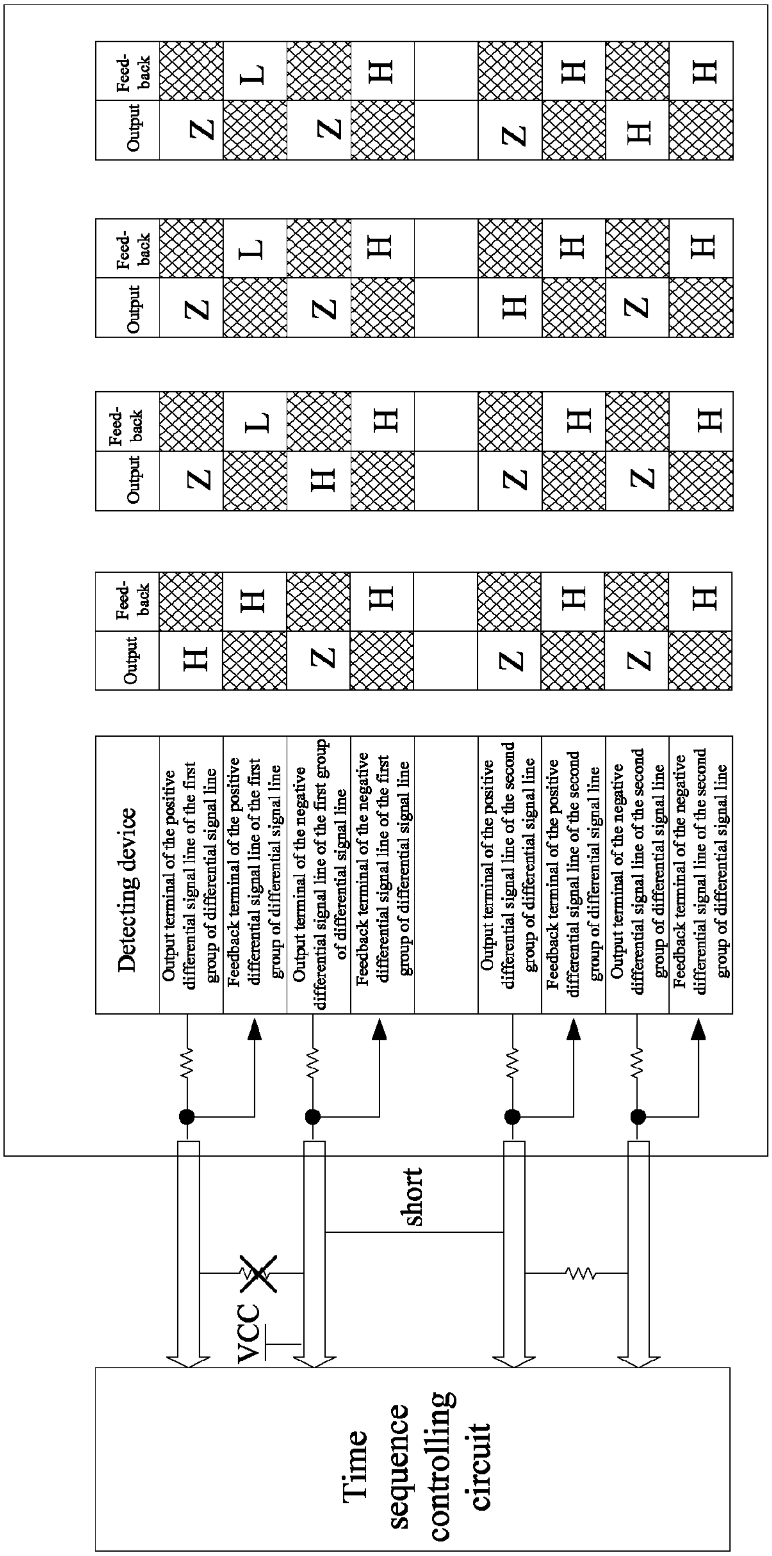
FIG. 4 is a schematic view showing the detecting result when the abnormality includes a short circuit between two adjacent groups of differential signal lines, a terminal resistive open of a first group of differential signal line, and a short circuit the first group of differential signal line to a power supply.

Referring to FIG. 4, which is a schematic view showing the detecting result when the abnormality includes the short circuit between two adjacent groups of differential signal lines, terminal resistive open of the first group of differential signal line, and short circuit of the first group of differential signal line to a power supply. The detecting result is shown as the followings:

When a high level signal is inputted to LVDS0+, and LVDS0−, LVDS1+, and LVDS1− are kept in high impedance states, the feedback signal received by the detecting device are HHHH;

when a high level signal is inputted to LVDS0−, and LVDS0+, LVDS1+, and LVDS1− are kept in high impedance states, the feedback signal received by the detecting device are LHHH;

when a high level signal is inputted to LVDS1+, and LVDS0+, LVDS0−, and LVDS1− are kept in high impedance states, the feedback signal received by the detecting device are LHHH;

when a high level signal is inputted LVDS1−, and LVDS0+, LVDS0−, and LVDS1+ are kept in high impedance states, the feedback signal received by the detecting device are LHHH.

Figure 5:
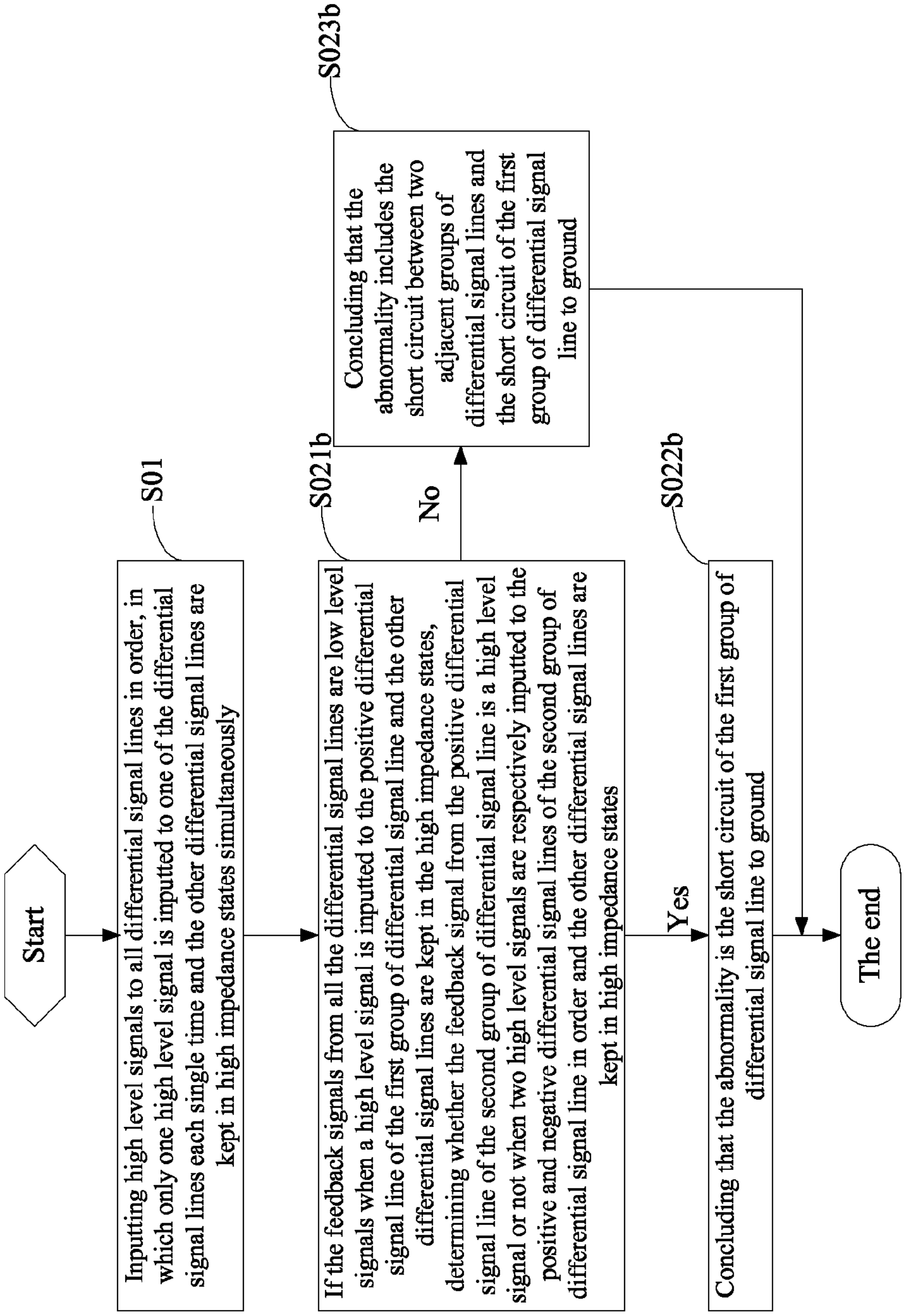
FIG. 5 is a flow chart of the step of determining the abnormality according to feedback signals of the detecting method of FIG. 1 in accordance with a second embodiment of the present disclosure.

Referring to FIG. 5, the step of determining the abnormality according to the feedback signal of the detecting method, in accordance with a second embodiment, is shown. The step S02 in the second embodiment specifically includes the following steps:

Step S021*b*, if the feedback signals from all the differential signal lines are low level signals when a high level signal is inputted to the positive differential signal line of the first group of differential signal line and the other differential signal lines are kept in the high impedance states, determining whether the feedback signal from the positive differential signal line of the second group of differential signal line is a high level signal or not when two high level signals are respectively inputted to the positive and negative differential signal lines of the second group of differential signal line in order and the other differential signal lines are kept in high impedance states. If the feedback signal from the positive differential signal line is a high level signal at this time, the step S022*b* is implemented, otherwise the step S023*b* is implemented.

Step S022*b*, concluding that the abnormality is the short circuit of the first group of differential signal line to ground.

Figure 6:
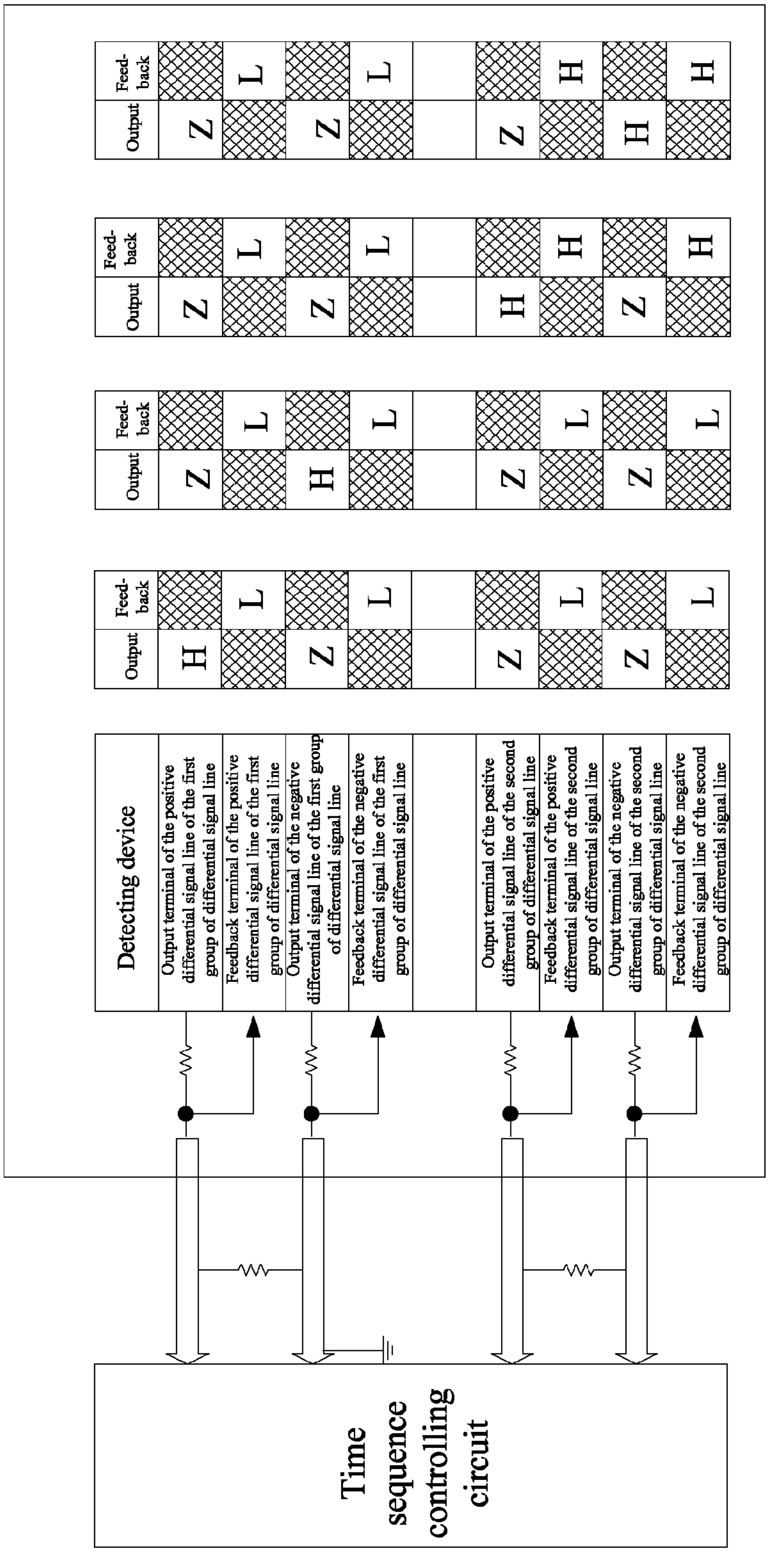
FIG. 6 is a schematic view showing the detecting result when the abnormality is a short circuit of the first group of differential signal line to ground.

Referring to FIG. 6, which is a schematic view showing the detecting result when the abnormality is the short circuit of the first group of differential signal line to ground. The detecting result is shown as the followings:

when a high level signal is inputted to LVDS0+, and LVDS0−, LVDS1+, and LVDS1− are kept in high impedance states, the feedback signals received by the detecting device are LLLL;

when a high level signal is inputted to LVDS0−, and LVDS0+, LVDS1+, and LVDS1− are kept in high impedance states, the feedback signals received by the detecting device are LLLL;

when a high level signal inputted to LVDS1+, and LVDS0+, LVDS0−, and LVDS1− are kept in high impedance states, the feedback signals received by the detecting device are LLHH; and when a high level signal is inputted to LVDS1−, and LVDS0+, LVDS0−, and LVDS1+ are kept in high impedance states, the feedback signals received by the detecting device are LLHH.

Step S023*b*, concluding that the abnormality includes the short circuit between two adjacent groups of differential signal lines and the short circuit of the first group of differential signal line to ground.

Figure 7:
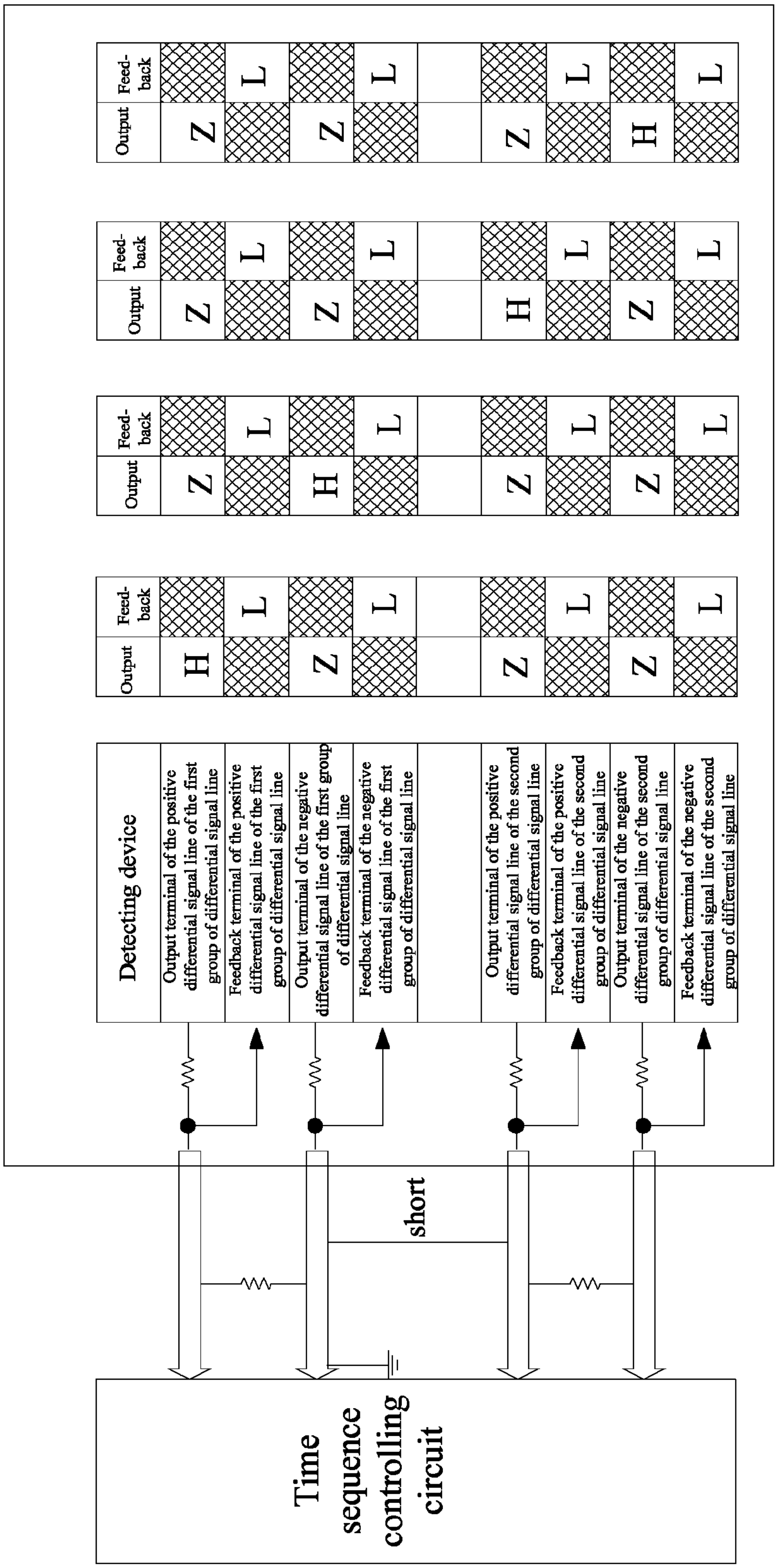
FIG. 7 is a schematic view showing the detecting result when the abnormality includes the short circuit between two adjacent groups of differential signal lines and the short circuit of the first group of differential signal line to ground.

Referring to FIG. 7, which is a schematic view showing the detecting result when the abnormality includes the short circuit between two adjacent groups of differential signal lines and the short circuit of the first group of differential signal line to ground. The detecting result is shown as the followings:

when a high level signal is inputted to LVDS0+, and LVDS0−, LVDS1+, and LVDS1− are kept in high impedance states, the feedback signals received by the detecting device are LLLL;

when a high level signal is inputted to LVDS0−, and LVDS0+, LVDS1+, and LVDS1− are kept in high impedance states, the feedback signals received by the detecting device are LLLL;

when a high level signal is inputted to LVDS1+, and LVDS0+, LVDS0−, and LVDS1− are kept in high impedance states, the feedback signals received by the detecting device are LLLL; and when a high level signal is inputted to LVDS1−, and LVDS0+, LVDS0−, and LVDS1+ are kept in high impedance state, the feedback signals received by the detecting device are LLLL.

Figure 8:
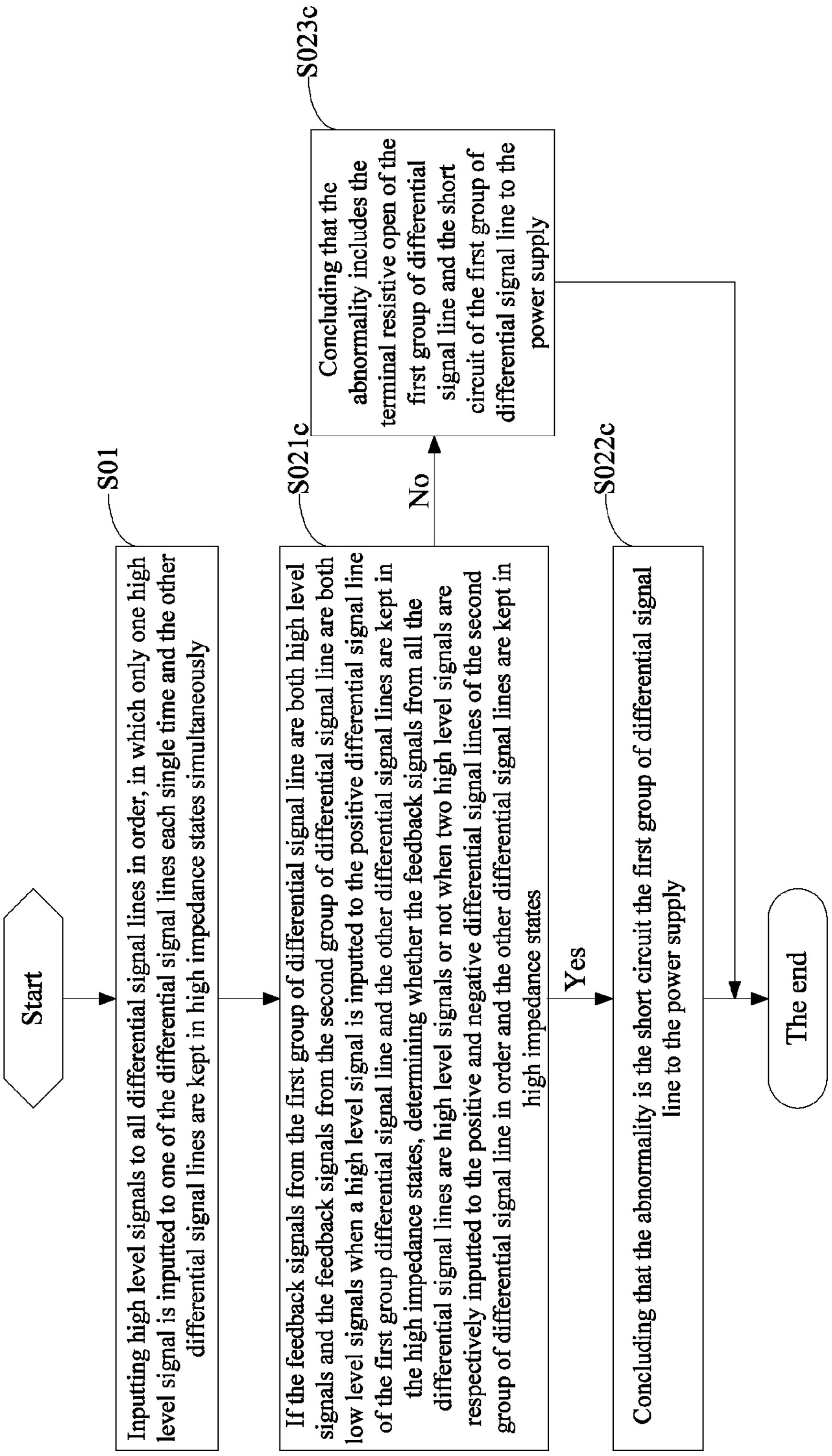
FIG. 8 is a flow chart of the step of determining the abnormality according to feedback signals of the detecting method of FIG. 1 in accordance with a third embodiment of the present disclosure.

Referring to FIG. 8, the step of determining the abnormality according to feedback signal of the detecting method, in accordance with a third embodiment, is shown. The step S02 in the third embodiment specifically includes the following steps:

Step S021*c*, if the feedback signals received from the first group of differential signal lines are both high level signals and the feedback signals from the second group of differential signal lines are both low level signals when a high level signal is inputted to the positive differential signal line of the first group differential signal line and the other differential signal lines are kept in the high impedance states, determining whether the feedback signals from all the differential signal lines are high level signals or not when two high level signals are respectively inputted to the positive and negative differential signal lines of the second group of differential signal line in order and the other differential signal lines are kept in high impedance states. If the feedback signals from the all the differential signal lines are high level signals at this time, the step S022*c* is implemented, otherwise the step S023*c* is implemented.

Step S022*c*, concluding that the abnormality is the short circuit the first group of differential signal line to the power supply.

Figure 9:
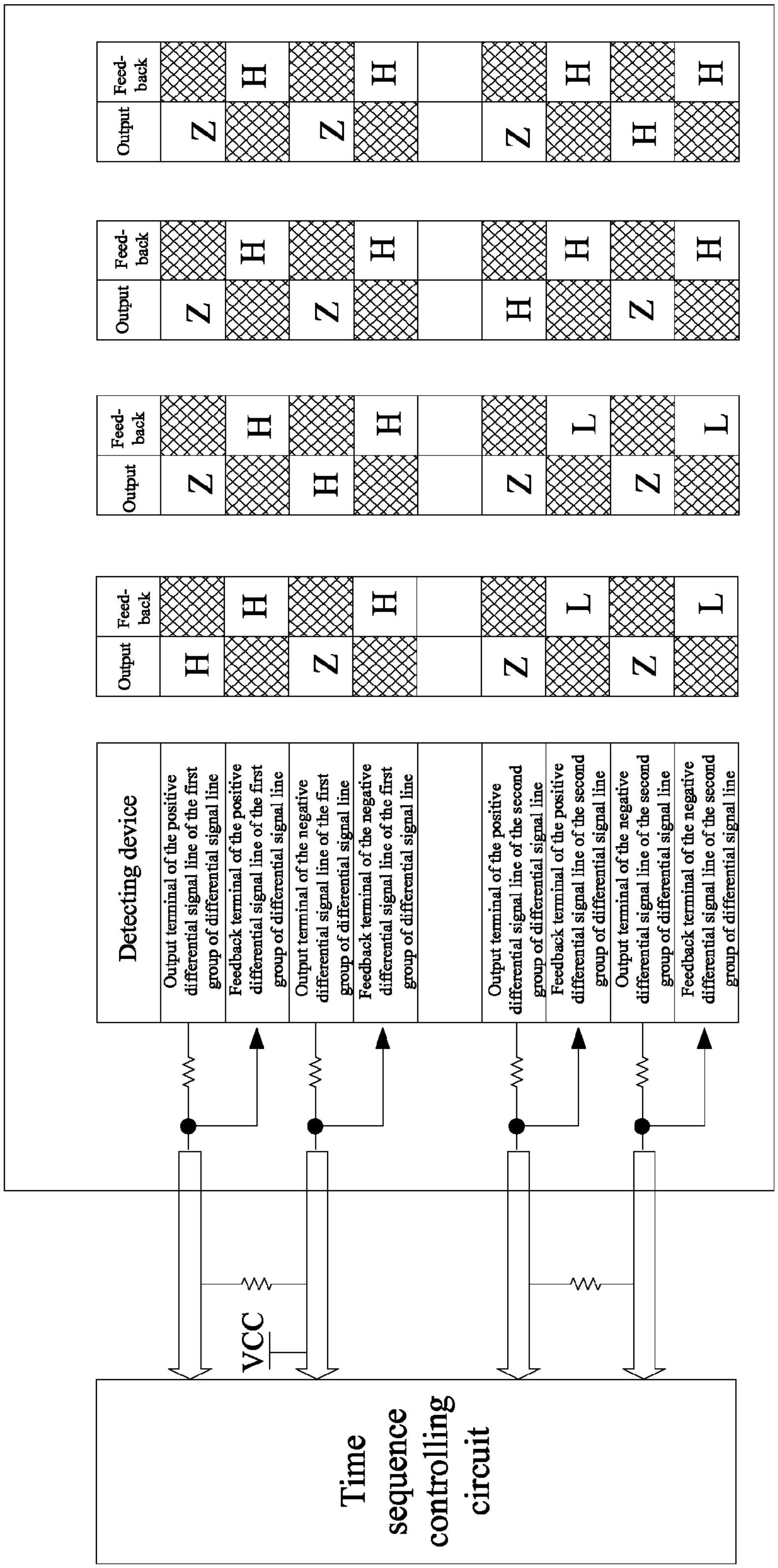
FIG. 9 is a schematic view showing the detecting result when the abnormality is the short circuit of the first group of differential signal line to the power supply.

Referring to FIG. 9, which is a schematic view showing the detecting result of the when the abnormality is the short circuit of the first group of differential signal line to the power supply. The detecting result can be shown as the followings:

when a high level signal is inputted to LVDS0+, and LVDS0−, LVDS1+, and LVDS1− are kept in high impedance states, the feedback signals received by the detecting device are HHLL;

when a high level signal is inputted to LVDS0−, and LVDS0+, LVDS1+, and LVDS1− are kept in high impedance states, the feedback signals received by the detecting device are HHLL;

when a high level signal is inputted to LVDS1+, and LVDS0+, LVDS0−, and LVDS1− are kept in high impedance states, the feedback signals received by the detecting device are HHHH; and when a high level signal is inputted to LVDS1−, and LVDS0+, LVDS0−, and LVDS1+ are kept in high impedance states, the feedback signals received by the detecting device are HHHH.

Step S023*c*, concluding that the abnormality includes the terminal resistive open of the first group of differential signal line and the short circuit of the first group of differential signal line to the power supply.

Figure 10:
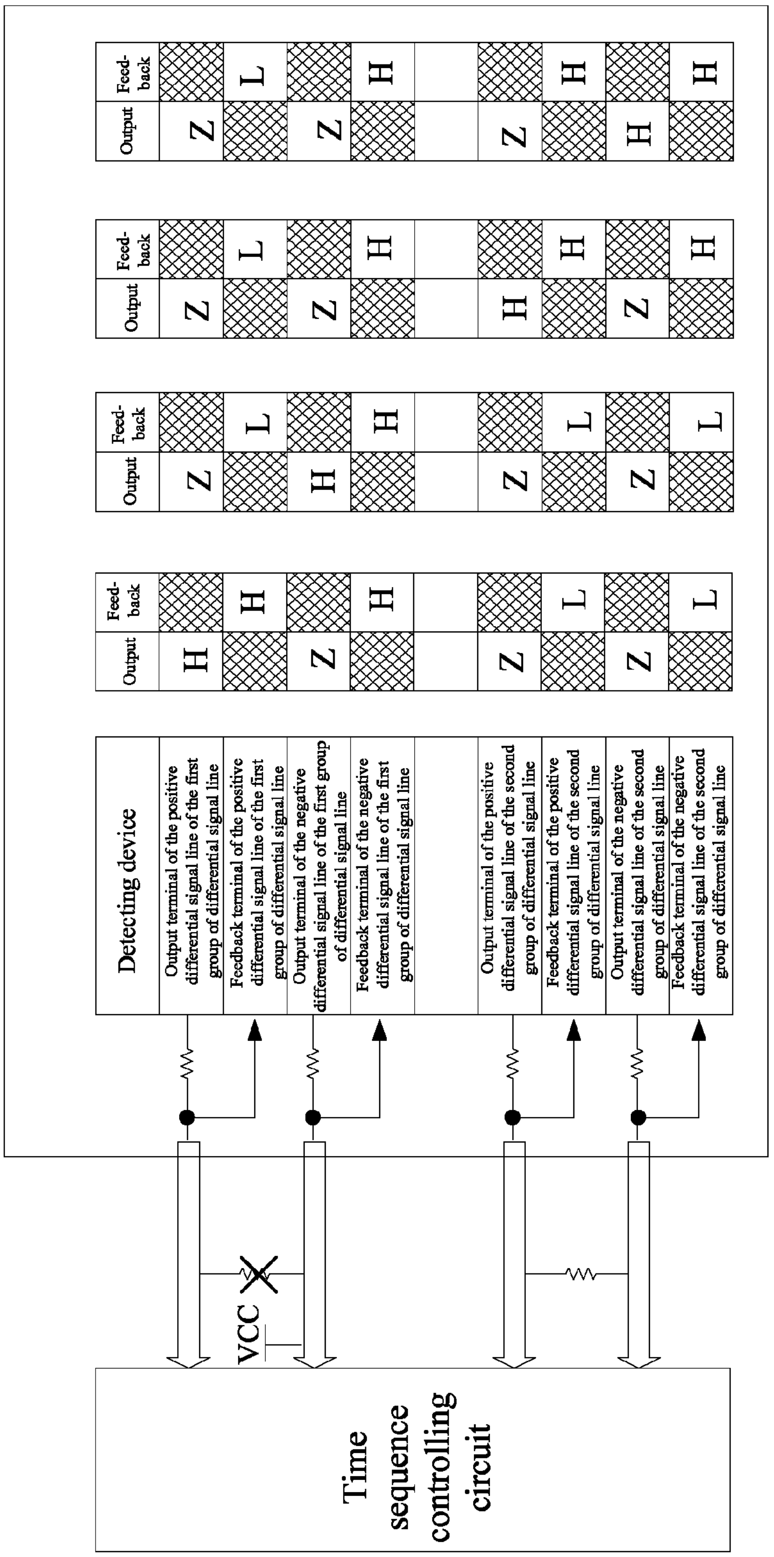
FIG. 10 is a schematic view showing the detecting result when the abnormality includes the terminal resistive open of the first group of differential signal line, and the short circuited to the power supply of the first group of differential signal line.

Referring to FIG. 10, which is a schematic view showing the detecting result when the abnormality includes the terminal resistive open of the first group of differential signal line, and the short circuit of the first group of differential signal line to the power supply. The detecting result can be shown as the followings:

when a high level signal is inputted to LVDS0+, and LVDS0−, LVDS1+, and LVDS1− are kept in high impedance states, the feedback signals received by the detecting device are HHLL;

when a high level signal is inputted to LVDS0−, and LVDS0+, LVDS1+, and LVDS1− are kept in high impedance states, the feedback signals received by the detecting device are LHLL;

when a high level signal is inputted to LVDS1+, and LVDS0+, LVDS0−, and LVDS1− are kept in high impedance states, the feedback signals received by the detecting device are LHHH; and when a high level signal is inputted to LVDS1−, and LVDS0+, LVDS0−, and LVDS1+ are kept in high impedance states, the feedback signals received by the detecting device are LHHH.

Figure 11:
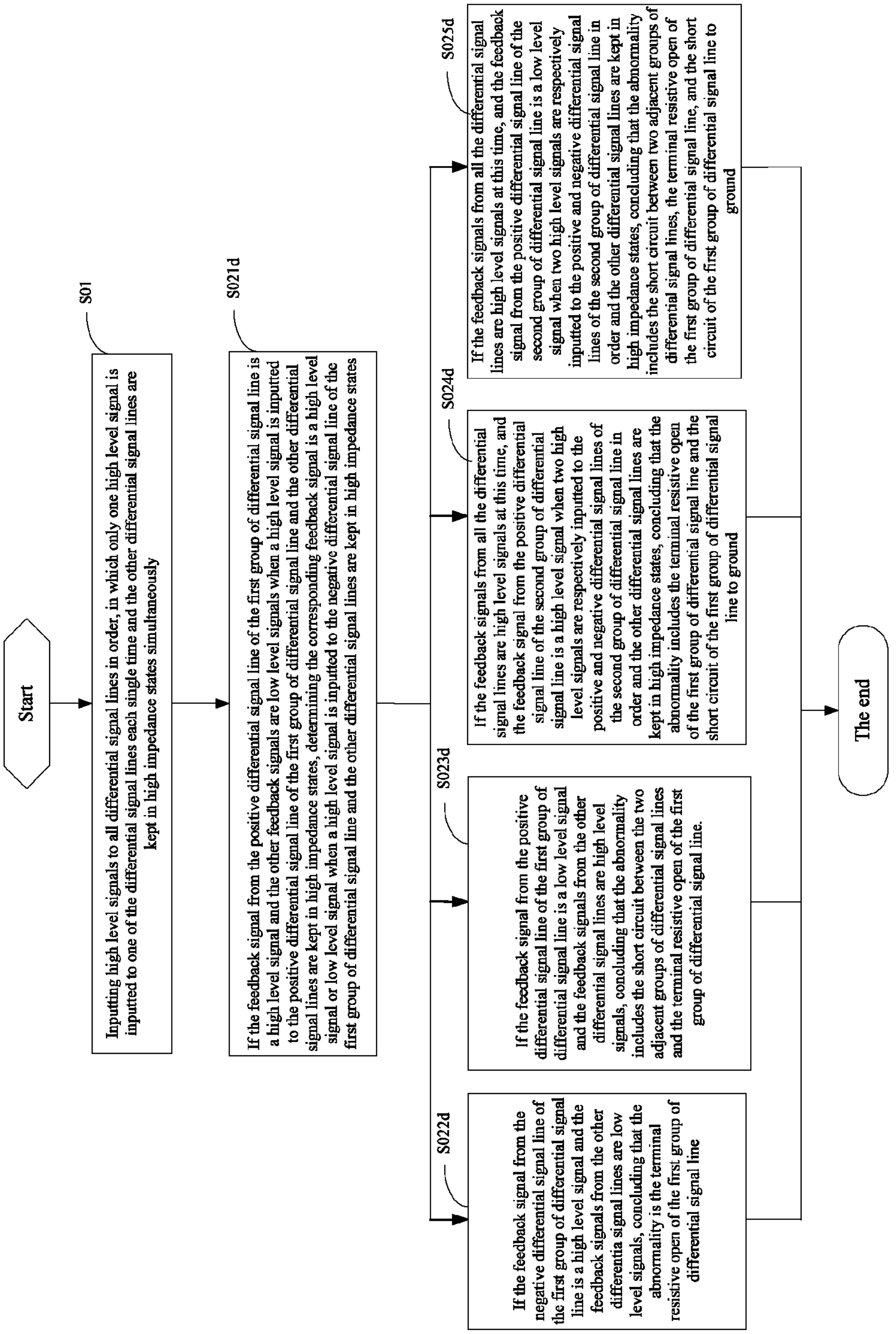
FIG. 11 is a flow chart of the step of determining the abnormality according to feedback signal of the detecting method of FIG. 1 in accordance with a fourth embodiment of the present disclosure.

Referring to FIG. 11, the step of determining the abnormality according to feedback signal of the detecting method, in accordance with a fourth embodiment, is shown. The step S02 in the fourth embodiment specifically includes the following steps:

Step S021*d*, if the feedback signal from the positive differential signal line of the first group of differential signal line is a high level signal and the other feedback signals are low level signals when a high level signal is inputted to the positive differential signal line of the first group of differential signal line and the other differential signal lines are kept in high impedance states, determining the corresponding feedback signal is a high level signal or low level signal when a high level signal is inputted to the negative differential signal line of the first group of differential signal line and the other differential signal lines are kept in high impedance states;

Step S022*d*, if the feedback signal from the negative differential signal line of the first group of differential signal line is a high level signal and the feedback signals from the other differentia signal lines are low level signals, concluding that the abnormality is the terminal resistive open of the first group of differential signal line.

Figure 12:
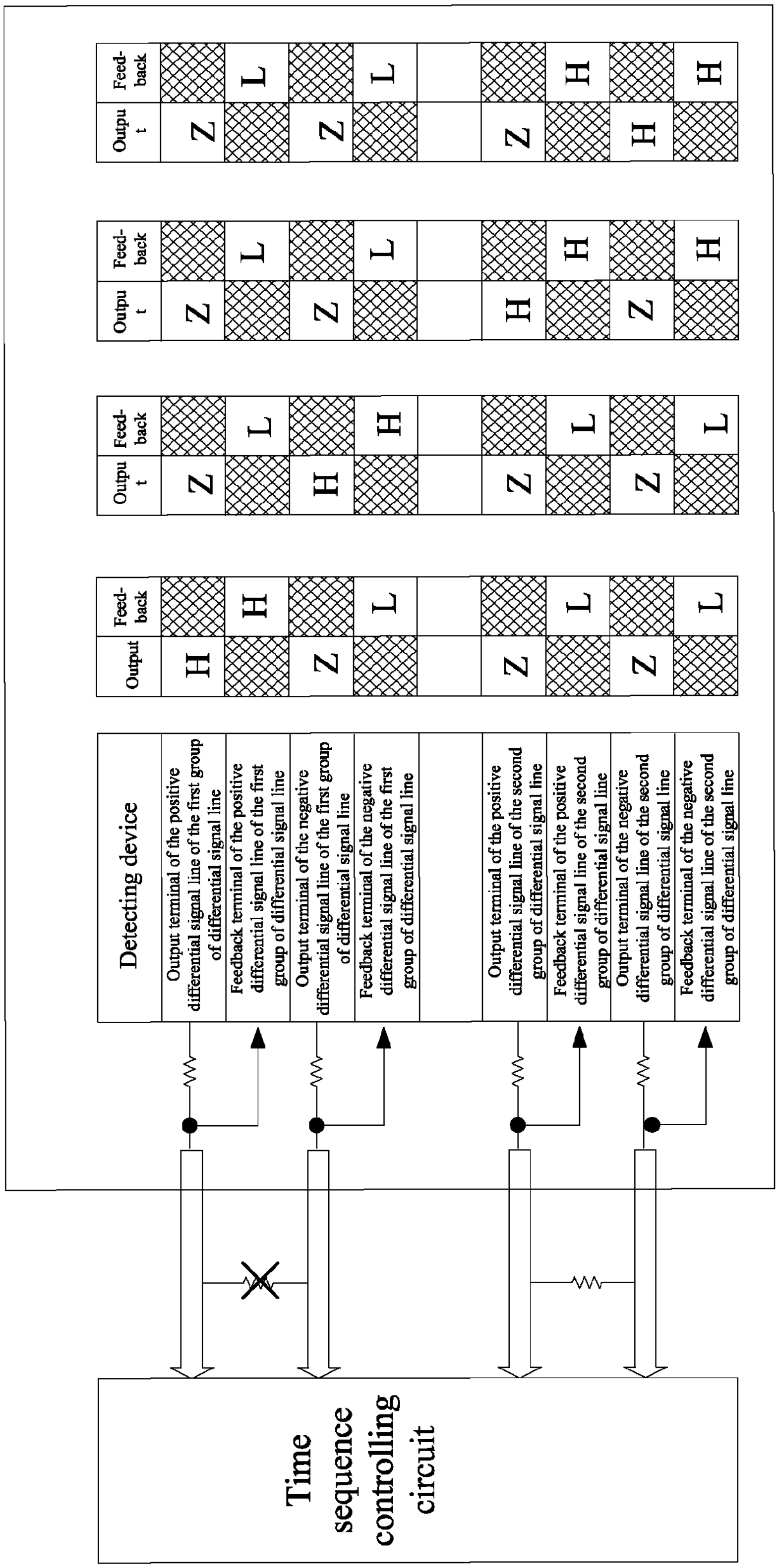
FIG. 12 is a schematic view showing the detecting result when the abnormality includes the terminal resistive open of a first group of differential signal line.

Referring to FIG. 12, which is a schematic view showing the detecting result when the abnormality includes the terminal resistive open of a first group of differential signal line. The detecting result is shown as the followings:

When a high level signal is inputted to LVDS0+, and LVDS0−, LVDS1+, and LVDS1− are kept in high impedance states, the feedback signals received by the detecting device are HLLL;

when a high level signal is inputted to LVDS0−, and LVDS0+, LVDS1+, and LVDS1− are kept in high impedance states, the feedback signals received by the detecting device are LHLL;

when a high level signal is inputted to LVDS1+, and LVDS0+, LVDS0−, and LVDS1− are kept in high impedance states, the feedback signals received by the detecting device are LLHH; and when a high level signal is inputted to LVDS1−, and LVDS0+, LVDS0−, and LVDS1+ are kept in high impedance states, the feedback signals received by the detecting device are LLHH.

Step S023*d*, if the feedback signal from the positive differential signal line of the first group of differential signal line is a low level signal and the feedback signals from the other differential signal lines are high level signals, concluding that the abnormality includes the short circuit between the two adjacent groups of differential signal lines and the terminal resistive open of the first group of differential signal line.

Figure 13:
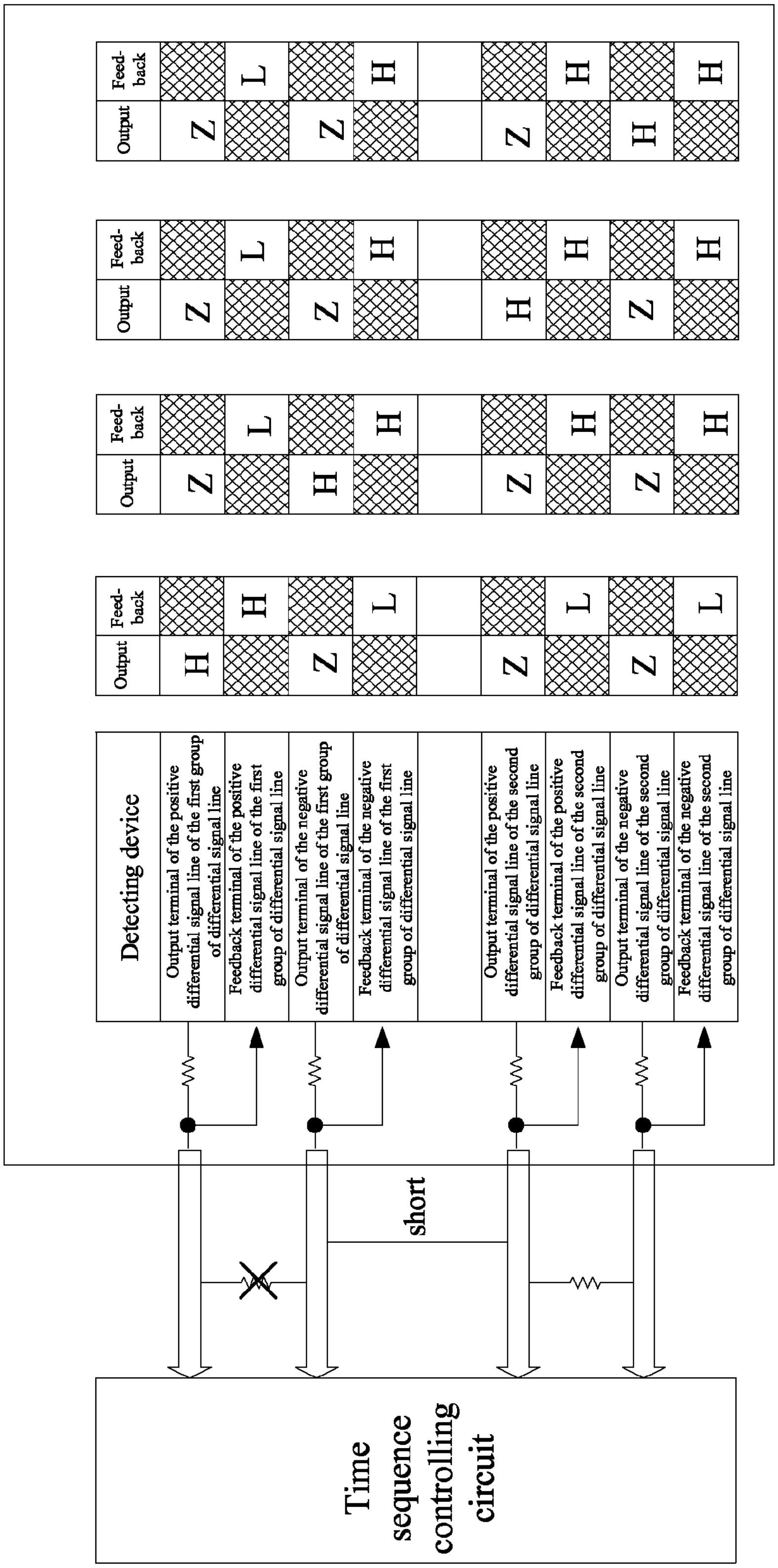
FIG. 13 is a schematic view showing the detecting result when the abnormality includes the short circuit between two adjacent groups of differential signal lines and the terminal resistive open of the first group differential signal line.

Referring to FIG. 13, which is a schematic view showing the detecting result when the abnormality includes the short circuit between two adjacent groups of differential signal lines and the terminal resistive open of the first group of differential signal line. The detecting result is shown as the followings:

when a high level signal is inputted to LVDS0+, and LVDS0−, LVDS1+, and LVDS1− are kept in high impedance states, the feedback signals received by the detecting device are HLLL;

when a high level signal is inputted to LVDS0−, and LVDS0+, LVDS1+, and LVDS1− are kept in high impedance states, the feedback signals received by the detecting device are LHHH;

when a high level signal is inputted to LVDS1+, and LVDS0+, LVDS0−, and LVDS1− are kept in high impedance states, the feedback signals received by the detecting device are LHHH;

when a high level signal is inputted to LVDS1−, and LVDS0+, LVDS0−, and LVDS1+ are kept in high impedance states, the feedback signals received by the detecting device are LHHH.

Step S024*d*, if the feedback signals from all the differential signal lines are high level signals at this time, and the feedback signal from the positive differential signal line of the second group of differential signal line is a high level signal when two high level signals are respectively inputted to the positive and negative differential signal lines of the second group of differential signal line in order and the other differential signal lines are kept in high impedance states, concluding that the abnormality includes the terminal resistive open of the first group of differential signal line and the short circuit of the first group of differential signal line to ground.

Figure 14:
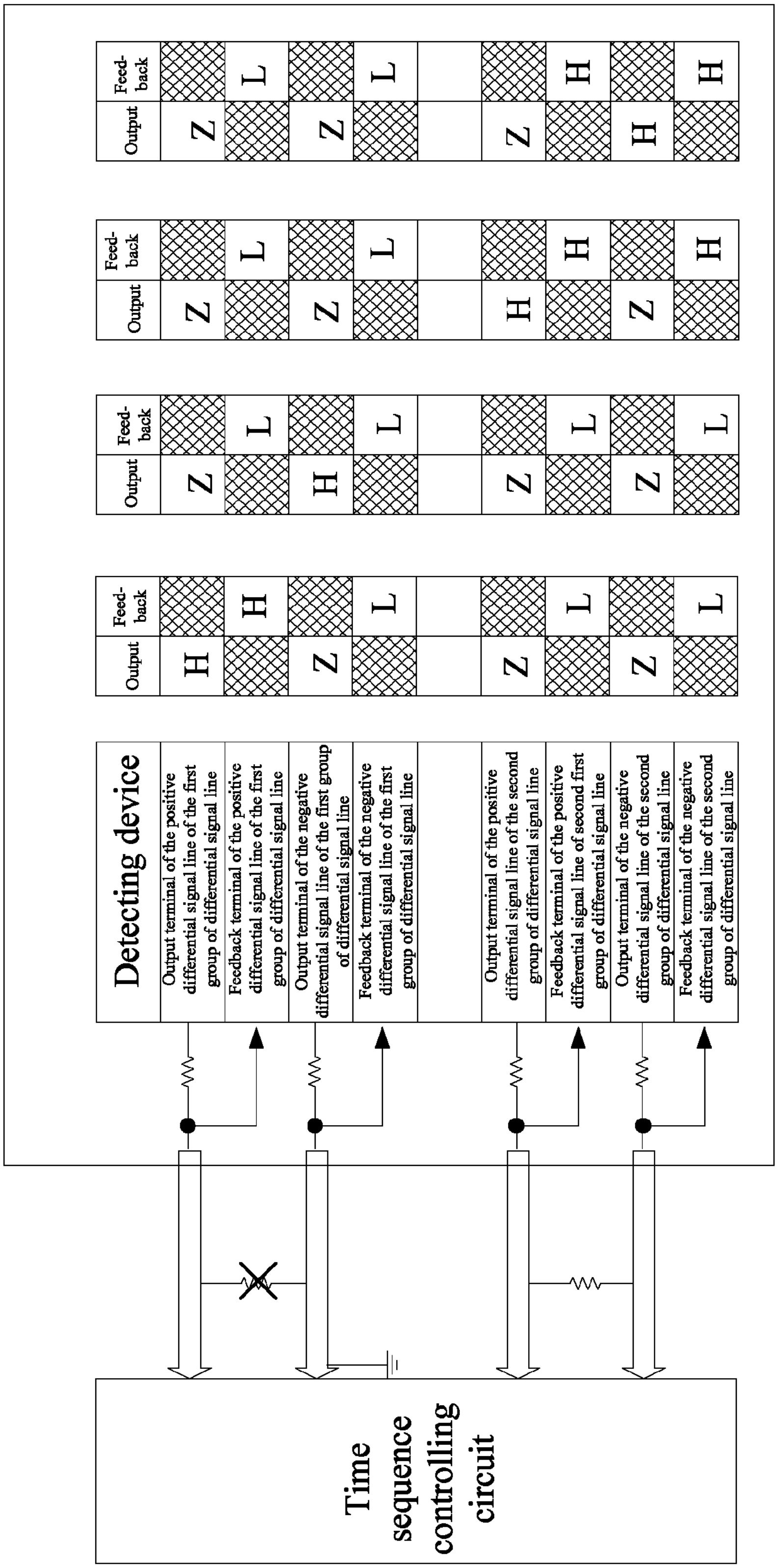
FIG. 14 is a schematic view showing the detecting result when the abnormality includes the terminal resistive open of the first group differential signal line and the short circuit the first group of differential signal line to ground.

Referring to FIG. 14, which is a schematic view showing the detecting result when the abnormality includes the terminal resistive open of the first group of differential signal line and the short circuit of the first group of differential signal line to ground. The detecting result is shown as the followings:

when a high level signal is inputted to LVDS0+, and LVDS0−, LVDS1+, and LVDS1− are kept in high impedance states, the feedback signals received by the detecting device are HLLL;

when a high level signal is inputted to LVDS0−, and LVDS0+, LVDS1+, and LVDS1− are kept in high impedance states, the feedback signals received by the detecting device are LLLL;

when a high level signal is inputted to LVDS1+, and LVDS0+, LVDS0−, and LVDS1− are kept in high impedance states, the feedback signals received by the detecting device are LLHH; and when a high level signal is inputted to LVDS1−, and LVDS0+, LVDS0−, and LVDS1+ are kept in high impedance states, the feedback signals received by the detecting device are LLHH.

Step S025*d*, if the feedback signals from all the differential signal lines are high level signals at this time, and the feedback signal from the positive differential signal line of the second group of differential signal line is a low level signal when two high level signals are respectively inputted to the positive and negative differential signal lines of the second group of differential signal line in order and the other differential signal lines are kept in high impedance states, concluding that the abnormality includes the short circuit between two adjacent groups of differential signal lines, the terminal resistive open of the first group of differential signal line, and the short circuit of the first group of differential signal line to ground.

Figure 15:
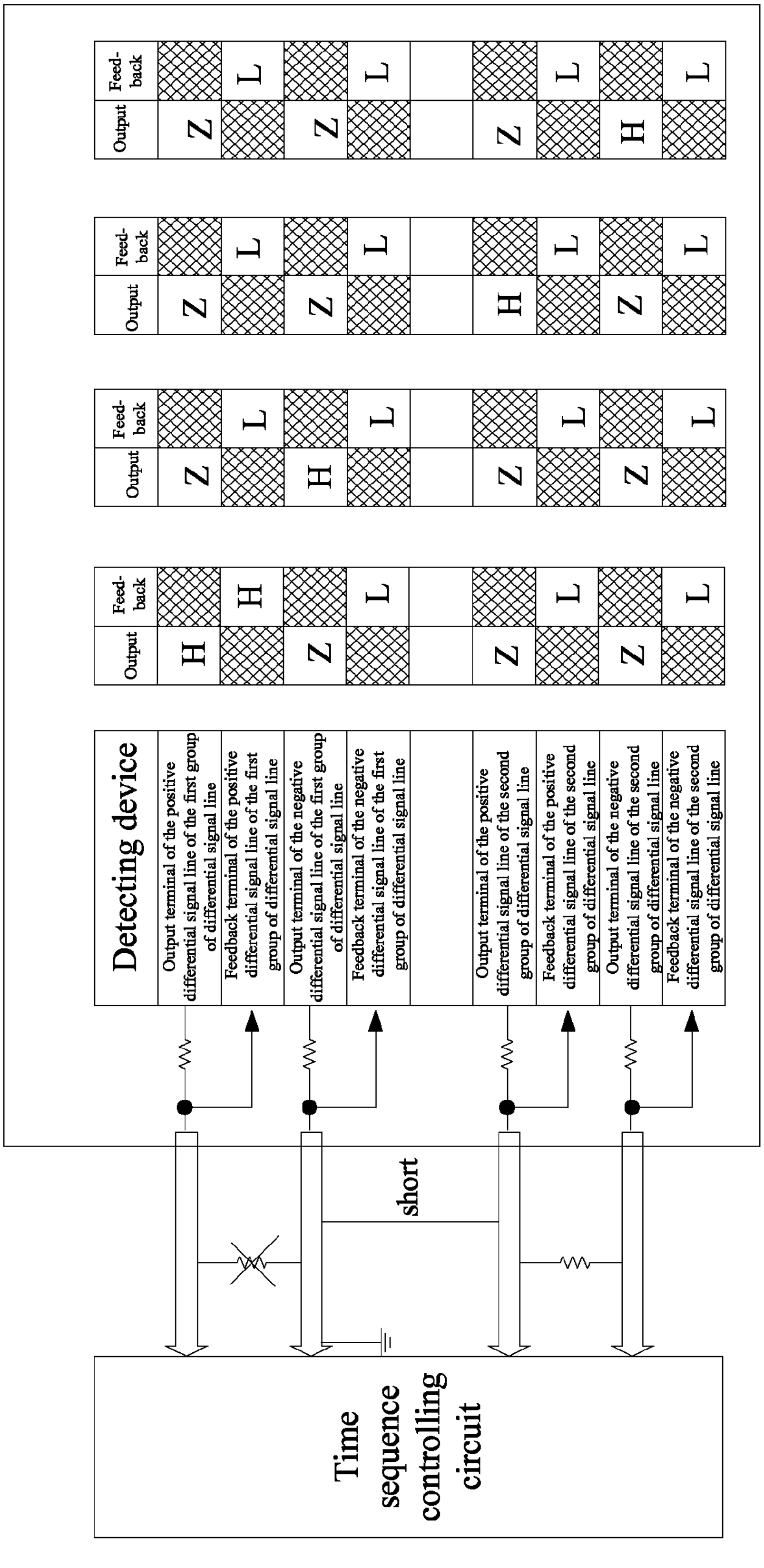
FIG. 15 is a schematic view showing the detecting result when the abnormality includes the short circuit between two adjacent groups of differential signal lines, the terminal resistive open of the first group of differential signal line and the short circuit of the first group of differential signal line to ground.

Referring to FIG. 15, which is a schematic view showing the detecting result when the abnormality includes the short circuit between two adjacent groups of differential signal lines, the terminal resistive open of the first group of differential signal line and the short circuit of the first group of differential signal line to ground. The detecting result is shown as the followings:

when a high level signal is inputted to LVDS0+, and LVDS0−, LVDS1+, and LVDS1− are kept in high impedance states, the feedback signals received by the detecting device are HLLL;

when a high level signal is inputted to LVDS0−, and LVDS0+, LVDS1+, and LVDS1− are kept in high impedance states, the feedback signals received by the detecting device are LLLL;

when a high level signal is inputted to LVDS1+, and LVDS0+, LVDS0−, and LVDS1− are kept in high impedance states, the feedback signals received by the detecting device are LLLL; and when a high level signal is inputted to LVDS1−, and LVDS0+, LVDS0−, and LVDS1+ are kept in high impedance states, the feedback signals received by the detecting device are LLLL.

By inputting high level signals to the differential signal lines in order and receiving the feedback signal from each of the differential signal lines, whether the differential signal receiving terminal of the liquid crystal displaying module is abnormal or not can be determined according to the feedback signals without manual test. This reduces the labor cost and time cost, and further improves the detecting efficiency of the abnormality.

It is noted that the above detecting method can also used for detecting the terminal resistive open of the second group of differential signal line, the short circuit of the second group of differential signal line to the power supply or ground. Additionally, the position of the abnormality can also be located by the above detecting method, which is much more conveniently.

Moreover, in other embodiments, the differential signal receiving terminal of the liquid crystal displaying module may include more than two groups of the differential signal lines, like three groups of the differential signal lines. In this situation, the first and second groups of differential signal lines can be used as detecting units for detecting whether the differential signal receiving terminal is abnormal or not at first. Then the second and third groups of differential signal lines can be used as the detecting units for detecting whether the differential signal receiving terminal is abnormal or not by using the above detecting method. In this way, all the differential signal lines of the liquid crystal displaying module can be detected.

Figure 16:
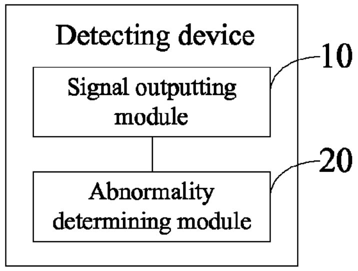
FIG. 16 is a schematic view of a detecting device of abnormality of differential signal receiving terminal of a liquid crystal displaying module.

Referring to FIG. 16, which is a schematic view of a detecting device of abnormality of differential signal receiving terminal of a liquid crystal displaying module. The detecting device further includes a signal outputting module 10 and an abnormality determining module 20.

The signal outputting module 10 is used for outputting high level signals to a detecting unit having two adjacent groups of differential signal lines. The signal outputting module outputs high level signals to all the differential signal lines in order. The signal outputting module 10 only outputs one high level signal to one of the differential signal lines each single time and the other differential signal lines are kept in high impedance states at the same time.

The abnormality is used for determining module 20 receives the feedback signals from all the differential signal lines and determining whether the corresponding differential signal line is normal or not according to the received feedback signals.

In a first embodiment, the signal outputting module 10 can be a signal generator for generating a number of signals, such as four signals. The signal generator only outputs one high level signal in each single time and the other three signals are in high impedance states. The signal outputting module 10 is connected to the differential signal receiving terminal of the liquid crystal displaying module. In another embodiment, the signal outputting module 10 can be a transmitting device with one end thereof connected to a peripheral device (such as a signal generator) and the other end thereof connected to the differential signal receiving terminal of the liquid crystal displaying module. The peripheral device is capable of outputting four signals, and only one signal outputted from the peripheral device is high level signal in each single time and the other three signals are kept in high impedance states.

The abnormality determining module 20 receives the feedback signals from all the differential signal lines and determines whether the receiving terminal is abnormal or not. It is noted that there are a number of groups of feedback signals in the embodiment, and the number of the feedback signals is the same as the number of the differential signal lines. The abnormality determining module 20 determines the abnormality after all the feedback signals are received.

By inputting high level signals to the differential signal lines in order and receiving the feedback signal from each of the differential signal lines, whether the differential signal receiving terminal of the liquid crystal displaying module is abnormal or not can be determined according to the feedback signals without manual test. This reduces the labor cost and time cost, and further improves the detecting efficiency of the abnormality.

Figure 17:
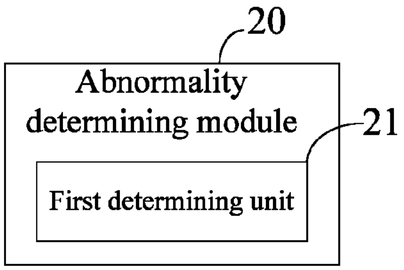
FIG. 17 is a schematic view of an abnormality determining module of the detecting device of FIG. 16 in accordance with a first embodiment of the present disclosure.

Referring to FIG. 17, an abnormality determining module of the detecting device, in accordance with a first embodiment of the present disclosure is shown. The abnormality determining module in the first embodiment specifically includes a first determining unit 21.

The first determining unit 21 is used for determining whether all the feedback signals are high level signals when a high level signal is inputted to the positive differential signal line of the first group of differential signal line and the other differential signal lines are kept in high impedance states. If the all the feedback signals are high level signals, the first determining unit 21 further determines whether all the feedback signals are high level signals when a high level signal is inputted to the negative differential signal line of the first group of differential signal line and the other differential signal lines are kept in high impedance states.

The first determining unit 21 concludes that the abnormality is the short circuit between two adjacent groups of differential signal lines if all the feedback signals are high level signals.

Otherwise, the first determining unit 21 concludes that the abnormality includes the short circuit between two adjacent groups of differential signal lines, the terminal resistive open of the first group of differential signal line, and the short circuit to the power supply of the first group of differential signal lines.

Figure 18:
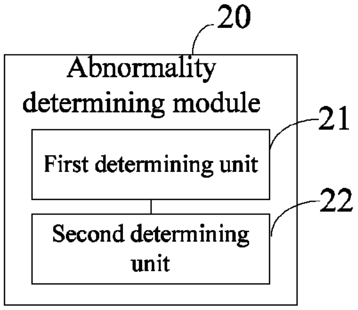
FIG. 18 is a schematic view of an abnormality determining module of the detecting device of FIG. 16 in accordance with a second embodiment of the present disclosure.

Referring to FIG. 18, an abnormality determining module of the detecting device, in accordance with a second embodiment of the present disclosure is shown. The abnormality determining module in the embodiment further includes a second determining unit 22.

The second determining unit 22 is used for determining whether all the feedback signals are low level signals or not when a high level signal is inputted to the positive differential signal line of the first group of the differential signal line and the other differential signal lines are kept in high impedance states. If all the feedback signals are all low level signals, the second determining unit 22 further determines whether the feedback signal from the positive differential signal line of the second group of differential signal line is a high level signal or not when two high level signals are respectively inputted to the positive and negative differential signal lines of the second group of differential signal line in order and the other differential signals are kept in high impedance states.

The second determining unit 22 concludes that the abnormality is the short circuit of the first group of differential signal line to ground if the feedback signal from the positive differential signal line of the second group of differential signal line is a high level; otherwise, the second determining unit 22 concludes that the abnormality includes the short circuit between two adjacent groups of the differential signal lines and the short circuit of the first group of differential signal line to ground.

Figure 19:
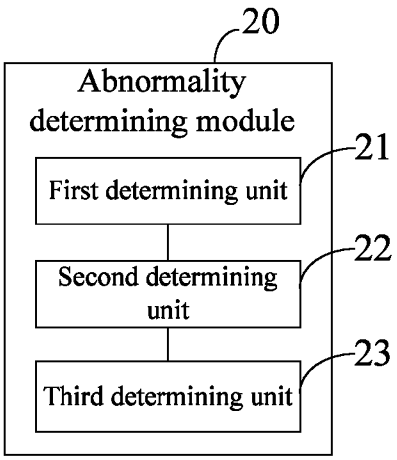
FIG. 19 is a schematic view of an abnormality determining module of the detecting device of FIG. 16 in accordance with a third embodiment of the present disclosure.

Referring to FIG. 19, an abnormality determining module of the detecting device, in accordance with a third embodiment of the present disclosure is shown. The abnormality determining module 20 in the third embodiment further includes a third determining unit 23.

The third determining unit 23 is used for determining whether the feedback signals from the first group of differential signal line are both high level signals and the feedback signals from the second group of differential signal lines are both low level signals or not when a high level signal is inputted to the positive differential signal line and the other differential signals are kept in high impedance states. If the feedback signals from the first group of differential signal lines are both high level signals and the feedback signals from the second group of differential signal lines are both low level signals, the third determining unit 23 further determines whether all the feedback signals are high level signals or not when two high level signals are respectively inputted to the positive and negative differential signal lines of the second group of differential signal line in order and the other differential signal lines are kept in high impedance states.

The third determining unit 22 concludes that the abnormality is the short circuit of the first group of differential signal line to ground if all the feedback signals are high level signals. Otherwise, the third determining unit 22 concludes that the abnormality includes the terminal resistive open of the first group of differential signal line and the short circuit of the first group of differential signal line to ground.

Figure 20:
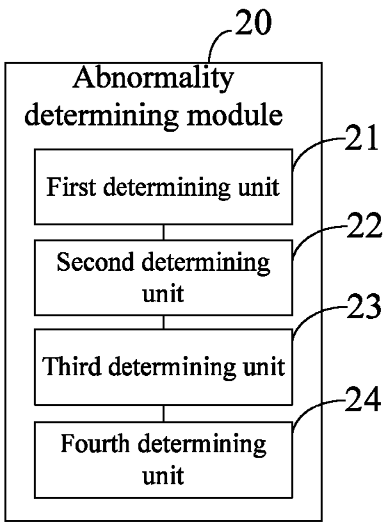
FIG. 20 is a schematic view of an abnormality determining module of the detecting device of FIG. 16 in accordance with a fourth embodiment of the present disclosure.

Referring to FIG. 20, an abnormality determining module of the detecting device, in accordance with a fourth embodiment of the present disclosure is shown. The determining module 20 in the fourth embodiment includes a fourth determining unit 24.

The fourth determining unit 24 is used for determining whether the feedback signal from the positive differential signal line of the first group of differential signal line is a high level signal and the feedback signals from the other differential signal lines are low level signals or not when a high level signal is inputted to the positive differential signal line of the first group of differential signal line and the other differential signal lines are kept in high impedance states. If the feedback signal from the positive differential signal line of the first group of differential signal line is a high level signal and the feedback signals from the other differential signal lines are low level signals, the fourth determining unit 24 is further used for determining whether the corresponding feedback signal is a high level signal or a low level signal when a high level signal is inputted to the negative differential signal line of the first group of differential signal line and the other differential signal lines are kept in high impedance states.

Specifically, the fourth determining unit 24 concludes that the abnormality is the terminal resistive open of the first group of differential signal line when the feedback signal from the negative differential signal line of the first group of differential signal line is a high level signal and the other feedback signals from the other differential signal line are low level signals;

the fourth determining unit 24 concludes that the abnormality includes the short circuit between two adjacent groups of differential signal lines and the terminal resistive open of the first group of differential signal line if the feedback signal from the positive differential signal line of the first group of differential signal line is a low level signal and the feedback signal from the other differential signal lines are high level signals;

if all the feedback signals are low level signals at this time, and the feedback signal from the positive differential signal line is a high level signal when two high level signals are respectively inputted to the positive and negative differential signal lines of the second group of differential signal line in order and the other differential signal lines are kept in high impedance states, the fourth determining unit 24 concludes that the abnormality includes the terminal resistive open of the first group of differential signal line and the short circuit of the first group of differential signal line to ground;

if all the feedback signals are low level signals at this time, and the feedback signal from the positive differential signal line of the second group of differential signal line is a low level signal when two high level signals are respectively inputted to the positive and negative differential signal lines of the second group of differential signal line in order and the other differential signal lines are kept in high impedance states, the fourth determining unit 24 concludes that the abnormality includes the short circuit between two adjacent groups of differential signal lines, the terminal resistive open of the first group of differential signal line and the short circuit of the first group of differential signal line to ground.

Even though information and the advantages of the present embodiments have been set fourth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A detecting method of abnormality of a differential signal receiving terminal of a liquid crystal displaying module, the receiving terminal comprising a first group of differential signal line having LVDS0+ and LVDS0−, and a second group of differential signal line having LVDS1+ and LVDS1−, the detecting method comprising:

inputting high level signals to LVDS0+, LVDS0−, LVDS1+, LVDS− in order, in which only one high level signal is inputted to one of the differential signal lines each single time and the other differential signal lines are kept in high impedance states simultaneously; and receiving feedback signals from all the differential signal lines and determining whether the differential signal lines of detecting units are abnormal or not according to the received feedback signals, the abnormality of the differential signal lines comprising a terminal resistive open of each group of differential signal line, a short circuit between two groups of the differential signal lines, and a short circuit of each group of differential signal line to ground or to a power supply caused by abnormal power supplying sequence.

2. The detecting method as claimed in claim 1, wherein if the feedback signals from the differential signal lines are HHHH, HHHH, HHHH, and HHHH when high level signals are respectively inputted to the differential signal lines LVDS0+, LVDS0−, LVDS1+, and LVDS1− in order, concluding that the abnormality is the short circuit between two adjacent groups of differential signal lines.

3. The detecting method as claimed in claim 1, wherein if the feedback signals from the differential signal lines are LLLL, LLLL, LLHH, and LLHH when high level signals are respectively inputted to the differential signal lines LVDS0+, LVDS0−, LVDS1+, and LVDS1− in order, concluding that the abnormality is the short circuit of the first group of differential signal line to ground; if the feedback signals from the differential signal lines are HHLL, HHLL, HHHH, and HHHH, concluding that the abnormality is the short circuit of the first group of differential signal line to the power supply.

4. The detecting method as claimed in claim 1, wherein if the feedback signals from the differential signal lines are HLLL, LHLL, LLHH, and LLHH when high level signals are respectively inputted to the differential signal lines LVDS0+, LVDS0−, LVDS1+, and LVDS1− in order, concluding that the abnormality is the terminal resistive open of the first group of differential signal line.

5. The detecting method as claimed in claim 1, wherein if the feedback signals from the differential signal lines are HHHH, LHHH, LHHH, and LHHH when high level signals are respectively inputted to the differential signal lines LVDS0+, LVDS0−, LVDS1+, and LVDS1− in order, concluding that the abnormality includes the short circuit between two adjacent groups of differential signal lines, the terminal resistive open of the first group of differential signal line, and the short circuit of the first group of differential signal line to the power supply.

6. The detecting method as claimed in claim 1, wherein if the feedback signals from the differential signal lines are LLLL, LLLL, LLLL, and LLLL when high level signals are respectively inputted to the differential signal lines LVDS0+, LVDS0−, LVDS1+, and LVDS1− in order, concluding that the abnormality comprises the short circuit between two adjacent groups of differential signal lines and the short circuit of the first group of differential signal line to ground.

7. The detecting method as claimed in claim 1, wherein if the feedback signals from the differential signal lines are HHLL, LHLL, LHHH, and LHHH when high level signals are respectively inputted to the differential signal lines LVDS0+, LVDS0−, LVDS1+, and LVDS1− in order, concluding that the abnormality comprises the short circuit between two adjacent groups of differential signal lines and the short circuit of the first group of differential signal line to the power supply; if the feedback signals from the differential signal lines are HLLL, LLLL, LLHH, and LLHH, concluding that the abnormality comprises the terminal resistive open of the differential signal lines and the short circuit of the first group of differential signal line to ground.

8. The detecting method as claimed in claim 1, wherein if the feedback signals from the differential signal lines are HLLL, LHHH, LHHH, and LHHH when high level signals are respectively inputted to the differential signal lines LVDS0+, LVDS0−, LVDS1+, and LVDS1− in order, concluding that the abnormality comprises the short circuit between two adjacent groups of differential signal lines and the terminal resistive open of the first group of differential signal line.

9. The detecting method as claimed in claim 1, wherein if the feedback signals from the differential signal lines are HLLL, LLLL, LLLL, and LLLL when high level signals are respectively inputted to the differential signal lines LVDS0+, LVDS0−, LVDS1+, and LVDS1− in order, concluding that the abnormality comprises the short circuit between two adjacent groups of differential signal lines, the terminal resistive open of the first group of differential signal line, and the short circuit of the first group of differential signal line to ground.

10. A detecting method of abnormality of a differential signal receiving terminal of a liquid crystal displaying module, comprising:

taking two adjacent groups of differential signal lines as a detecting unit, inputting high level signals to all differential signal lines of the detecting unit, in which only one high level signal is inputted to one of the differential signal lines each single time and the other differential signal lines are kept in high impedance states simultaneously; and receiving feedback signals from all the differential signal lines and determining whether the differential signal lines of the detecting unit are abnormal or not according to the feedback signals.

11. The detecting method as claimed in claim 10, wherein the step of determining whether the differential signal lines of the detecting unit are abnormal or not according to the feedback signals comprises:

if the feedback signals from all the differential signal lines are high level signals when a high level signal is inputted to a positive differential signal line of a first group of differential signal line and the other differential signal lines are kept in high impedance states, further determining whether the feedback signals from all the differential signal lines are high level signals or not when a high level signal is inputted to a negative differential signal line of the first group of differential signal line and the other differential signal lines are kept in high impedance states;

concluding that the abnormality comprises the short circuit between two adjacent groups of differential signal lines if the feedback signals from all the differential signal lines are high level signals; otherwise, concluding that the abnormality comprises the short circuit between two adjacent groups of differential signal lines, a terminal resistive open of the first group of differential signal line, and a short circuit of the first group of differential signal line to a power supply.

12. The detecting method as claimed in claim 10, wherein the step of determining whether the differential signal lines of the detecting unit are abnormal or not according to the feedback signals comprises:

if the feedback signals from all the differential signal lines are low level signals when a high level signal is inputted to the positive of the first group of differential signal line and the other differential signal lines are kept in high impedance states, further determining whether the feedback signal from a positive differential signal line of a second group of differential signal line is a high level signal or not when two high level signals are respectively inputted to the positive differential signal line and a negative differential line of the second group of differential signal line in order and the other differential signal lines are kept in high impedance states;

concluding that the abnormality comprises the short circuit of the first group of differential signal line to ground if the feedback signal from the positive differential signal line is a high level signal; otherwise, concluding that the abnormality comprises the short circuit between two adjacent groups of differential signal lines and the short circuit of the first group of differential signal line to ground.

13. The detecting method as claimed in claim 10, wherein the step of determining whether the differential signal lines of the detecting unit are abnormal or not according to the feedback signals comprises:

if the feedback signals from the first group of differential signal line are both high level signals and the feedback signals from the second group of differential signal line are both low level signals when a high level signal is inputted to the positive differential signal line of the first group of differential signal line and the other differential lines are kept in high impedance states, further determining that whether the feedback signals from all the differential signal lines are high level signals or not when two high level signals are respectively inputted to the positive differential signal line and the negative differential signal line of the second group of differential signal line in order and the other differential signal lines are kept in high impedance states;

concluding that the abnormality comprises the short circuit of the first group of differential signal line to the power supply if the feedback signals from all the differential signal lines are high level signals; otherwise, concluding that the abnormality comprises the terminal resistive open of the first group of differential signal line and the short circuit of the first group of differential signal line to the power supply.

14. The detecting method as claimed in claim 10, wherein the step of determining whether the differential signal lines of the detecting unit are abnormal or not according to the feedback signals comprises:

if the feedback signal from the positive differential signal line of the first group of differential signal line is a high level signal and the feedback signals from the other differential signal lines are low level signals when a high level signal is inputted to the positive differential signal line of the first group of differential signal line and the feedback signals from the other differential signal lines are kept in high impedance states, further determining the corresponding feedback signal is a high level signal or a low level signal when a high level signal is inputted to the negative differential signal line of the first group of differential signal line and the other differential signal lines are kept in high impedance states;

if the feedback signal from the positive differential signal line of the first group of differential signal line is a high level signal and the feedback signals from the other differential signal lines are low level signals, concluding that abnormality comprises the terminal resistive open of the first group of differential line;

if the feedback signal from the positive differential signal line of the first group of differential signal line is a low level signal and the feedback signals from the other differential signal lines are high level signals, concluding that the abnormality comprises the short circuit between two adjacent groups of differential signal lines and the terminal resistive open of the first group of differential signal line;

if the feedback signals from all the differential signal lines are low level signals, and the feedback signal from the positive differential signal line of the second group of differential signal line is a high level signal when two high level signals are respectively inputted to the positive differential signal line and the negative differential signal line of the second group of differential signal line in order and the other differential signal lines are kept in high impedance states, concluding that the abnormality comprises the terminal resistive open of the first group of differential signal line and the short circuit of the first group of differential signal line to ground;

if the feedback signals from all the differential signal lines are low level signals, and the feedback signal from the positive differential signal line of the second group of differential signal line is a low level signal when two high level signals are respectively inputted to the positive differential signal line and the negative differential signal line of the second group of differential signal line in order and the other differential signal lines are kept in high impedance states, concluding that the abnormality comprises the short circuit between two adjacent groups of differential signal lines, the terminal resistive open of the first group of differential signal line, and the short circuit of the first group of differential signal line to ground.

15. A detecting device of abnormality of differential signal receiving terminals of a liquid crystal displaying module, comprising:

a signal outputting module for outputting high level signals to differential signal lines of a detecting unit comprising two adjacent groups of differential signal lines, in which only one high level signal is inputted to one of the differential signal lines each single time and the other differential signal lines are kept in high impedance state simultaneously; and an abnormality determining module for receiving feedback signals from all the differential signal lines and determining the abnormality of the differential signal lines of the detecting unit according to the feedback signals.

16. The detecting device as claimed in claim 15, wherein the abnormality determining module comprises a first determining unit; the first determining unit is used for determining whether the feedback signals from all the differential signal lines are high level signals or not when a high level signal is inputted to a positive differential signal of a first group of differential signal line and the other differential signal lines are kept in high impedance states; if the feedback signals from all the differential signal lines are high level signals, the first determining unit further determines whether the feedback signals from all the differential signal lines are high level signals or not when a high level signal is inputted to a negative differential signal line of the first group of differential signal line and the other differential signal lines are kept in high impedance states;

the first determining unit concludes that the abnormality is the short circuit between two adjacent groups of differential signal lines if the feedback signals from all the differential signal lines are high level signals; otherwise the first determining unit concludes that the abnormality comprises a short circuit between two adjacent groups of differential signal lines, a terminal resistive open of the first group differential signal line, and a short circuit of the first group of differential signal line to a power supply.

17. The detecting device as claimed in claim 15, wherein the abnormality determining module further comprises a second determining unit, the second determining unit is used for determining whether the feedback signals from all the differential signal lines are low level signals or not when a high level signal is inputted to the positive differential signal line of the first group of differential signal line and the other differential signal lines are kept in high impedance states; if the feedback signals from all the differential signal lines are low level signals, the second determining unit determines whether the feedback signal from a positive differential signal line of a second group of differential signal line is high level signal or not when two high level signals are respectively inputted to the positive differential signal line and a negative differential signal line of the second group of differential signal line in order and the other differential signal lines are kept in high impedance states;

the second determining unit concludes that the abnormality is the short circuit of the first group of differential signal to ground if the feedback signal from the positive differential signal of the second group of differential signal line is high level signal; otherwise the second determining unit concludes that the abnormality comprises the short circuit between two adjacent groups of differential signal lines and the short of the first group of differential signal line to ground.

18. The detecting device as claimed in claim 15, wherein the abnormality determining module further comprises a third determining unit; the third determining unit is used for determining whether the feedback signals from the first group of differential signal line are both high level signals and the feedback signals from the second group of differential signal line are both low level signals or not when a high level signal is inputted to the positive differential signal line of the first group of differential signal line and the other differential signal lines are kept in high impedance states; if the feedback signals from the first group of differential signal line are both high level signals and the feedback signals from the second group of differential signal line are both low level signals, the third determining unit further determines whether the feedback signal from all the differential signal lines are high level signals or not when two high level signals are respectively inputted to the positive differential signal line and the negative differential signal line of the second group of differential signal line in order and the other differential signal lines are kept in high impedance states;

the third determining unit concludes that the abnormality is the short circuit of the first group of differential signal line to the power supply if the feedback signals from all the differential signal lines are high level signals; otherwise the third determining unit concludes that the abnormality comprises the terminal resistive open of the first group of differential signal line and the short circuit of the first group of differential signal line to the power supply.

19. The detecting device as claimed in claim 15, wherein the abnormality determining module further comprises a fourth determining unit; the fourth determining unit is used for determining whether the feedback signals from the positive differential signal line of the first group of differential signal line is a high level signal and the feedback signals from of the other differential signal lines are low level signals or not when a high level signal is inputted to the positive differential signal line of the first group of differential signal line and the other differential signal lines are kept in high impedance states; if the feedback signals from the positive differential signal line of the first group of differential signal line is a high level signal and the feedback signals from of the other differential signal lines are low level signals, the fourth determining unit further determines the corresponding feedback signal is a high level signal or a low level signal when a high level signal is inputted to the negative differential signal line of the second group of differential signal line and the other differential signal lines are kept in high impedance states;

if the feedback signal from the negative differential signal line of the first group of differential signal line is a high level signal and the feedback signals from the other differential signal lines are low level signals, the fourth determining unit concludes that the abnormality is the terminal resistive open of the first group of differential signal line;

if the feedback signal from the positive differential signal line of the first group of differential signal line is a low level signal and the feedback signals from the other differential signal line are high level signals, the fourth determining unit concludes that the abnormality comprises the short circuit between two adjacent groups of differential signal lines and the terminal resistive open of the first group of differential signal line;

if the feedbacks from all the differential signal lines are low level signals, and the feedback signal from the positive differential signal line of the second group of differential signal line is a high level signal when two high level signals are respectively inputted to the positive differential signal line and the negative differential signal line of the second group of differential signal line in order and the other differential signal lines are kept in high impedance states, the fourth determining unit concludes that the abnormality comprises the terminal resistive open of the first group of differential signal line and the short circuit of the first group of differential signal line to ground;

if the feedbacks from all the differential signal lines are low level signals, and the feedback signal from the positive differential signal line of the second group of differential signal line is a low level signal when two high level signals are respectively inputted to the positive differential signal line and the negative differential signal line of the second group of differential signal line in order and the other differential signal lines are kept in high impedance states, the fourth determining unit concludes that the abnormality comprises the short circuit between two adjacent groups of differential signal lines, the terminal resistive open of the first group of differential signal line and the short circuit of the first group of differential signal line to ground.

* * * * *